(12) United States Patent
Mayer et al.

(10) Patent No.: US 12,418,234 B2
(45) Date of Patent: *Sep. 16, 2025

(54) CONFIGURATION OF GATE DRIVERS WITH SHOOT THROUGH PROTECTION

(71) Applicant: Infineon Technologies AG, Neubiberg (DE)

(72) Inventors: Alexander Mayer, Treffen (AT); Jens Barrenscheen, Munich (DE); Christian Heiling, Graz (AT); Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 245 days.

This patent is subject to a terminal disclaimer.

(21) Appl. No.: 18/300,242

(22) Filed: Apr. 13, 2023

(65) Prior Publication Data
US 2024/0348149 A1 Oct. 17, 2024

(51) Int. Cl.
 *H02M 1/08* (2006.01)
 *H02M 1/32* (2007.01)
 *H02M 1/38* (2007.01)
 *H03K 17/687* (2006.01)

(52) U.S. Cl.
CPC ............... *H02M 1/38* (2013.01); *H02M 1/32* (2013.01); *H02M 1/08* (2013.01); *H03K 17/687* (2013.01)

(58) Field of Classification Search
CPC .............................................. H02M 1/08–088
See application file for complete search history.

(56) References Cited

U.S. PATENT DOCUMENTS

2020/0127571 A1\* 4/2020 Matsuda ........... H02M 3/33507
2025/0007409 A1\* 1/2025 Yanagida ................ H02M 1/08

OTHER PUBLICATIONS

U.S. Appl. No. 18/300,211, filed Apr. 13, 2023, naming inventors Mayer et al.
Brown et al., "Power MOSFET Basics: Understanding Gate Charge and Using it to Assess Switching Performance", Vishay, Feb. 16, 2016, 6 pp.
"How to Power and Control Brushless DC Motors", Digi-Key Electronics, Dec. 7, 2016, 10 pp.

(Continued)

*Primary Examiner* — Peter M Novak
(74) *Attorney, Agent, or Firm* — Shumaker & Sieffert, P.A.

(57) ABSTRACT

In general, the disclosure describes circuits and techniques to operate power switch driver circuits as well as techniques to dynamically change configuration parameters. The power switch driver circuit of this disclosure may be configured to received communication signals along the same signal paths as for pulse modulated switching control signals. In other words, the power switch driver circuit may receive a main function signaling, switching the power switches on and off, overlaid with a secondary function signaling, communication, which may include configuration parameters. In this manner the power switch driver circuit may receive both switching (commutation) function and communication function along the same signal path.

16 Claims, 11 Drawing Sheets

(56) References Cited

OTHER PUBLICATIONS

De Frutos, "Fully Protected H-Bridge IR3220S Architecture and Typical Application", International Rectifier, Application Note AN-1032, 2001, 10 pp., (Applicant points out, in accordance with MPEP 609.04(a), that the year of publication, 2001, is sufficiently earlier than the effective U.S. filing date, so that the particular month of publication is not an issue.).
"1EDI EiceDRIVER™ Compact, Separate output variant for IGBT", Data Sheet Rev. 2.0, Infineon Technologies AG, Nov. 10, 2014, 22 pp.
"Advantages of coreless-transformer gate drivers over gate drive optocouplers", Infineon Application Note AN-2022-01, Apr. 13, 2022, 30 pp.
"Pulse-width modulation", page last edited on Mar. 14, 2023, Wikipedia, Retrieved from: https://en.wikipedia.org/wiki/Pulse-width_modulation, Accessed on: Apr. 7, 2023, 12 pp.

* cited by examiner

CONFIGURATION OF GATE DRIVERS WITH SHOOT THROUGH PROTECTION

TECHNICAL FIELD

The disclosure relates power switch driver circuits.

BACKGROUND

Power switch driver circuits may control the operation of power switches, such as switches in a power inverter circuit. Some examples of power switches may include metal oxide semiconductor field effect transistors (MOSFET), insulated gate bipolar junction transistors (IGBT) and similar power semiconductors. Power switch circuits may also use configuration parameters for operation. Some examples of configuration parameters may include temperature limits, current limits, or other parameters.

SUMMARY

In general, the disclosure describes circuits and techniques to operate power switch driver circuits as well as techniques to dynamically change configuration parameters of the power switch driver circuits. A controller may operate power switches, such as a half-bridge circuit, through a power switch driver circuit. The controller may communicate with the power switch driver circuit to adjust configuration parameters during the switching operation. The power switch driver circuit of this disclosure may be configured to received communication signals along the same signal paths as for the pulse modulated control signals. In other words, the power switch driver circuit may receive a main function signaling, switching the power switches on and off, overlaid with a secondary function signaling, communication, which may include configuration parameters. In this manner the power switch driver circuit may receive both switching (commutation) function and communication function along the same signal path.

In one example, the disclosure describes a power switch driver circuit comprising: an input terminal, a detection circuit, configured to: receive a switching signal from the input terminal, and output and hold the received switching signal to a power switch for a first duration, a configuration decoding circuit, configured to: receive a communication signal from the input terminal, and receive a communication signal from the input terminal, decode the received communication signal, and output configuration information decoded from the communication signal. The configuration information sets behavior for the power switch driver circuitry, and a window generation circuit configured to: during a window comprising a second duration, maintain the switching signal from the detection circuit, wherein to maintain the switching signal comprises disabling the received switching signal, and allow decoding of the received communication signal during the window, wherein the second duration starts and ends within the first duration.

In another example, the disclosure describes a method comprising: receiving, by power switch driver circuitry, a switching signal at an input terminal to the power switch driver circuitry at a first time, in response to receiving the switching signal: supplying, by the power switch driver circuitry, a first drive signal to a control terminal of a power switch for a first duration, and waiting, by the power switch driver circuitry, for a second duration, wherein the second duration is based on circuit characteristics of the power switch and characteristics of the power switch driver circuitry, after the second duration, receiving, by the power switch driver circuitry and during the first duration, a second signal at the input terminal different from the switching signal, analyzing, by the power switch driver circuitry, the received second signal, determining, by the power switch driver circuitry, that the received second signal is a communication signal based on characteristics of the second signal, decoding, by the power switch driver circuitry, information in the communication signal, the information comprises configuration information, determining, by the power switch driver circuitry, that a communication window within the first duration has ended, in response to determining that the communication window has ended, preparing, by the power switch driver circuitry, to receive the switching signal at the input terminal, receiving, by the power switch circuitry, the switching signal at the input terminal at a second time subsequent to the first time, and in response to receiving the switching signal, supplying, by the power switch driver circuitry, a second drive signal to a control terminal of a power switch for a third duration.

A system comprising: a controller comprising processing circuitry, power switch driver circuitry comprising: an input terminal configured to connect to the controller, a detection circuit, configured to: receive a switching signal from the input terminal, and output and hold the received switching signal to a power switch for a first duration, a configuration decoding circuit, configured to: receive a communication signal from the input terminal, decode the received communication signal, and output configuration information decoded from the communication signal, wherein the configuration information sets behavior for the power switch driver circuitry, and a window generation circuit configured to: during a second duration comprising a window, maintain the switching signal from the detection circuit. To maintain the switching signal comprises disabling detection of a subsequent switching signal and allow decoding of the received communication signal during the window, wherein the second duration starts and ends within the first duration.

A power switch driver circuit comprising: a first input terminal and a second input terminal, a detection circuit, configured to: receive a switching signal from the first input terminal, and output and hold the received switching signal to a power switch for a first duration, protection circuitry configured to: receive: an STP signal from the second input terminal, and the held switching signal from the detection circuit, control a duration of a communication window, and a configuration decoding circuit, configured to: receive a communication signal from the first input terminal, and during the communication window, decode the received communication signal and output configuration information, wherein the configuration information sets behavior for the power switch driver circuitry.

A method comprising: receiving, by power switch driver circuitry, a switching signal at a first input terminal to the power switch driver circuitry at a first time, receiving, by power switch driver circuitry, a STP signal at a second input terminal to the power switch driver circuitry at a second time, receiving, by the power switch driver circuitry, a second signal at the first input terminal different from the switching signal, determining, by the power switch driver circuitry, whether the second signal is a communication signal based on the STP signal and the switching signal, in response to determining that the second signal is a communication signal, decoding, by the power switch driver circuitry, information in the communication signal. The information comprises configuration information, and wherein the configuration information sets behavior for the power switch driver circuitry.

A system comprising: a controller comprising processing circuitry, power switch driver circuitry comprising: a first input terminal and a second input terminal, wherein the first input terminal is configured to connect to the controller, a detection circuit, configured to: receive a switching signal from the first input terminal, and output and hold the received switching signal to a power switch for a first duration, protection circuitry configured to: receive: a STP signal from the second input terminal, and the held switching signal from the detection circuit, and control a duration of a communication window. The communication window starts and ends within the first duration, and a configuration decoding circuit, configured to: receive a communication signal from the first input terminal, and during the communication window, decode the received communication signal and output configuration information, wherein the configuration information sets behavior for the power switch driver circuitry.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1A:
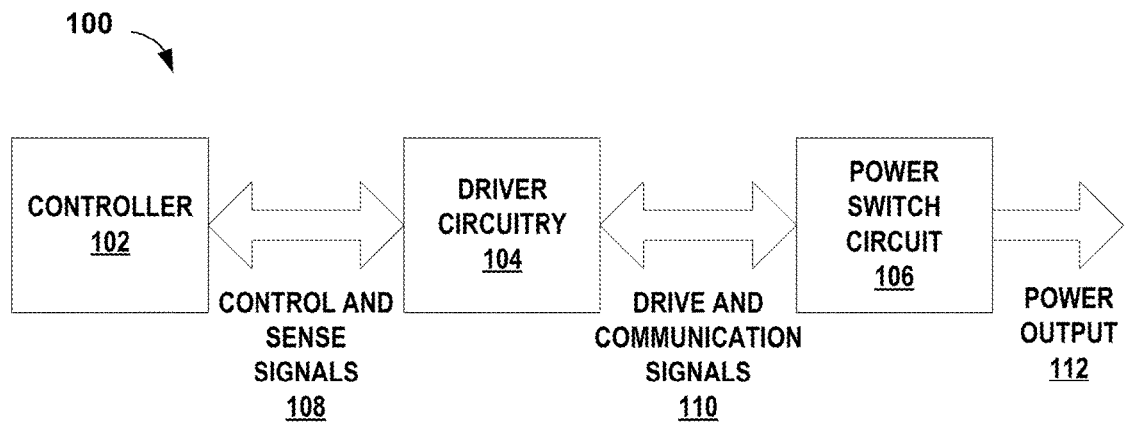
FIG. 1A is a block diagram illustrating an example system with a power switch driver circuit configured to receive switching and communication signals on the same wired terminal, according to one or more techniques of this disclosure.

The disclosure describes circuits and techniques to operate power switch driver circuits as well as techniques to dynamically change configuration parameters of the power switch driver circuits. A controller may operate power switches via the power switch driver circuit to control switching as well communicate with the power switch driver circuit to adjust configuration parameters during the switching operation. The system may control switching circuits for a variety of applications such as to control a motor, for power conversion including AC-DC and DC-DC conversion and other similar applications. The controller may maintain the output of the power switch circuit within desired operating limits, e.g., the output voltage and output power, in some examples by adjusting a commutation duty cycle of a pulse-modulated control signal to the power switch driver circuit. The power switch driver circuit of this disclosure may also be configured to received communication signals along the same signal paths as for the pulse modulated control signals. In other words, the power switch driver circuit may receive a main function signaling, switching the power switches on and off, overlaid with a secondary function signaling, communication, which may include configuration parameters. In this manner the power switch driver circuit may receive both switching (commutation) function and communication function along the same signal path.

The system of this disclosure, which may include a controller and one or more power switch driver circuits, may differentiate between the switching function and the communication function in one of two techniques, or in a combination of the two techniques. The system may output the main function timing based on a rising edge or falling edge. In between the rising edge and falling edge of each half-cycle is a communication "window." The power switch driver circuit may receive a switching time for an associated power switch based on a signal edge (rising or falling), then output and hold the command for the power switch. The command may be to switch ON or to switch OFF, based on the edge of the main function signal. In this disclosure, switching time refers to when, in the circuit operational cycle, to commutate the power switch (turn ON or OFF).

For the first technique, after a delay to allow the switch to transition, the power switch driver circuit may open a communication window for a predetermined duration. At the end of the predetermined duration, the communication window closes, and the power switch driver circuit may prepare for the next edge of the switching signal.

In the second technique, the power switch driver circuit may receive a second signal to enable or disable both the communication window and an edge detect function that reacts to the rising or falling edge of the main function signal. In the example of a half-bridge circuit, with a low-side switch and a high-side switch, this second signal may be the control terminal signal for the opposite switch. For example, for a high-side MOSFET, the second signal may be the gate control signal for the low-side MOSFET, and vice versa. The second signal may be considered a "status" signal or a shoot-through protection (STP) signal for the opposite switch and provide shoot-through protection for the half-bridge circuit. In this manner, the STP signal from the low-side switch that indicates that the low-side switch is ON and may first disable the edge detect function and prevent the high-side switch from also turning ON, thus providing shoot-through protection. In addition, the same STP signal from the low-side switch that disabled the edge detect may also enable the communication window for the high-side switch. That is, for the high-side switch driver circuit, an indication that the low-side switch is ON may also indicate that the high-side switch driver circuit may be able to receive communication signals.

FIG. 1A is a block diagram illustrating an example system with a power switch driver circuit configured to receive switching and communication signals on the same wired terminal, according to one or more techniques of this disclosure. System 100, in the example of FIG. 1A includes controller 102, driver circuitry 104 and power switch circuit 106.

Controller 102 may control the switching of power switch circuit 106 by sending control signals (108) to driver circuitry 104, which may include switching, communication, and configuration signals. In some examples controller 102 may also receive sense signals (108) from driver circuitry 104, e.g., switch status, temperature, mode, error flags, and similar communication from driver circuitry 104. Controller 102 may include one or more processors. Examples of processor in controller 102 may include any one or more of a microcontroller (MCU), e.g. a computer on a single integrated circuit containing a processor core, memory, and programmable input/output peripherals, a microprocessor (µP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

Driver circuitry 104 may include switching circuits, filters, amplifiers, buffers, one or more processors, isolation circuits, such as galvanic isolation and other components to drive power switch circuit 106. Driver circuitry 104 may control power switch circuit 106 using drive and communication signals 110 via the electrical connections to power switch circuit 106. In this disclosure, an electrical connection between driver circuitry 104 and power switch circuit 106 may carry both switching (commutation) signals as well as communication signals. In some examples, characteristics of the communication signal may include a modulation scheme. Some example modulation schemes may include one or more of: amplitude modulation (AM), frequency modulation (FM), pulse width modulation (PWM), pulse code modulation (PCM), local interconnect network (LIN), universal asynchronous receiver/transmitter (UART), controller area network (CAN), peripheral sensor interface (PSI), and PSI5.

Power switch circuit 106 may be configured with any type of power topology output power 112 for a variety of applications. Some examples of power topology may include a single switch for switching control of a load, one or more half-bridge or full bridge circuits for power conversion, motor control and similar applications.

Figure 1B:
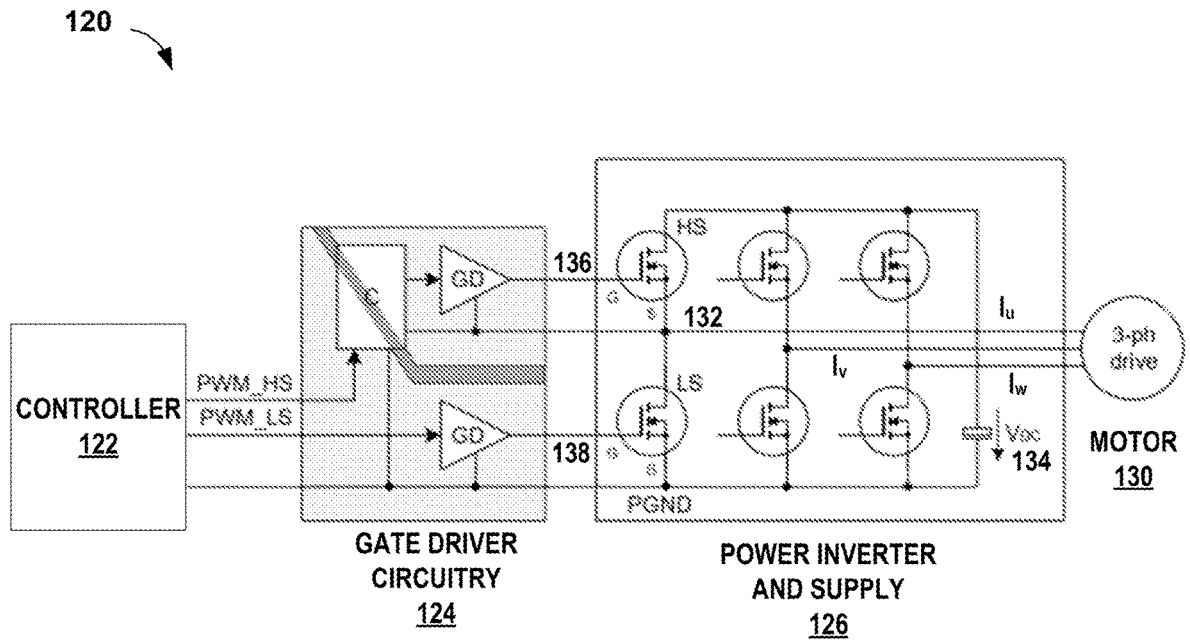
FIG. 1B is a block diagram illustrating a three-phase motor driver system that includes a power switch driver circuit that functions according to one or more techniques of this disclosure.

FIG. 1B is a block diagram illustrating a three-phase motor driver system that includes a power switch driver circuit that functions according to one or more techniques of this disclosure. System 120 in the example of FIG. 1B is one example implementation of system 100 described above in relation to FIG. 1A with the gate driver circuitry of this disclosure. The motor control circuit in the example of FIG. 1B is just one possible implementation of circuitry used as an example to describe the techniques of this disclosure. However, this disclosure is not limited to motor control and may be applied to any power topology.

The example of FIG. 1A illustrates an application block diagram for AC drive operation, e.g., for a 3-phase motor. Motor 130 connects to a power inverter structure that receives power from supply unit (VDC 134) delivering the energy to operate motor 130.

In the example of system 120, the power switch circuit is power inverter 126 with a B6 topology. In a B6 topology, each phase of motor 130 connects to a phase node, e.g., node 132 of a half-bridge switch topology with a high-side switch (HS, connecting the phase node to the positive supply rail of VDC) and a low-side switch (LS, connecting the phase node to the negative supply rail of VDC). The B6 topology is the one example topology for AC drive operation. Other topologies, such as multi-level converters, may also drive motor 130, or other loads. A phase node may also be referred to as a switch node (SW).

The driver circuitry is gate driver circuitry 124, which is configured to drive the gates (control terminals) of the metal oxide semiconductor field effect transistors (MOSFETs) that form the half-bridge circuits of power inverter 126. Other types of power switches with different types of control terminals may use different driver circuitry. The example shows the symbols for MOSFET power switches, but other types of power switches may be used in the scope of this disclosure, such as insulated gate bipolar junction transistors (IGBTs), silicon carbide (SiC) or gallium nitride (GaN) and other switches.

Gate driver circuitry 124 is the link between the control device, controller 122, generating the switching control signals (PWM_xy) to operate the power switches in the power inverter unit (on/off control). Controller 122 is an example of controller 102 described above in relation to FIG. 1A and may have the same or similar functions and characteristics. Controller 122 may control each power switch of the power inverter 126, though gate driver lines are only shown to the first half-bridge to simplify the diagram. As noted above controller 122 may be any type of control device, e.g., a microcontroller µC or any other type of pulse modulated generation unit. Pulse modulated signals in this disclosure may include pulse density modulation (PDM), pulse-width modulation (PWM), which is a special case of PDM where the switching frequency is fixed, pulse frequency modulated (PFM), pulse amplitude modulation (PAM) and other type of pulse modulated signals.

Gate driver circuitry 124 contains several voltage domains, because of the structure of the B6 bridge. Each power switch requires a control signal with respect to a defined reference level (e.g., the source connection S of each power switch in the example of system 120). The reference level for the low-side switches is PGND and for the high-side switches are the switching nodes, in the example of FIG. 1B.

An individual control signal (G) controls each power switch in power inverter 126. Gate driver circuitry 124 outputs each control signal, adapted to the required voltage level for the individual power switch. In some examples, e.g., for power MOSFETs, several independent (smaller) power switch devices may connect in parallel to increase the overall current capability of the parallel structure (not shown in FIG. 1B). In this description, such a parallel connection is also considered as a single power switch, because parallel switches may form one bigger power switch.

In steady state operation of a three-phase AC drive, the three phase currents Iu, Iv, and Iw may be sine-waves (not shown in FIG. 1B). The frequency of the phase currents defines the rotational speed of the motor, and the amplitude of the phase current relates to the torque of the motor.

Some example phase current frequencies may include frequencies in the range between 0 and a few hundred Hertz (Hz), depending on the construction of the motor. The relation of the amplitudes of the phase currents may change with the rotation of the rotor. For example, during operation, in one segment of time, phase current Iu delivers a current with the biggest positive value and phase current Iw may be at the most negative phase current. In this same time segment, (not shown in FIG. 1B), phase current Iv may have an electrical current magnitude somewhere between Iu and Iw. In another time segment, the phase currents change values.

To generate the "smooth" phase currents with reasonable losses in the power switches, the power switches are operated in on/off mode, controlled by the pulse modulated, e.g., PWM signals, generated by controller 122. The duty cycle of the switching signal of each switch in relation to the other switches may define the resulting phase current shape. Duty cycle, in the example of PWM, is the relation between ON-time of a switch and overall PWM period The inductive-resistive (L/R) time constant of the motor winding smoothens the effects of the on/off operation of the power switches.

In some examples, the PWM frequency of a power switch is much faster than the frequency of the phase currents. For example, a PWM frequency values may include frequencies in the range from 4 kHz to 30 kHz, depending on the power switch and the maximum phase current amplitude, while the phase current may be in the 100 Hz range, as noted above. This leads to the fact, that there is always a certain number of PWM periods (on/off cycles of a power switch) in each of the time segment.

There are usually two types of losses in a power switch. First, conduction losses, which are caused by the voltage drop over the power switch in conducting mode and the current through the switch. In a MOSFET this voltage drop may be based on the $R_{DS-ON}$ for the MOSFET. A second type of loss is commutation losses, caused by the switching activity (on/off=conducting/not conducting) of the power switch, as controlled by the control signals.

The commutation losses may depend on how a power switch is driven by gate driver circuit 124, e.g., by the amplitude and profile of the applied gate current for each on/off and off/on transition of the power switch. Furthermore, the timing of the PWM signals between the two power switches, i.e., the high-side and the low-side of the same motor phase influences the commutation losses. The dead-time is a time during the on/off transition of one of the two power switches and the off/on transition of the other of the two power switches. During the dead-time, both power switches are controlled to be off, to avoid a short circuit in the inverter bridge leg (also referred to as break before make). In half-bridge or full-bridge switching circuits, the timing of the dead-time for the power switching cycle of each pair of HS and LS switches, e.g., the duration of the dead time compared to the duration of the overall switching cycle and duty cycle influences the commutation loss.

Various configuration parameters, such as the shape of the gate current as well as the dead time duration may be adjusted to improve the commutation losses. Because the amplitude of the phase currents change with motor rotation, the shape of the gate currents and the dead time may be dynamically adapted to the actual phase current value to improve the losses. Some examples of configuration parameters, e.g., a set of commutation parameters that define the commutation speed and influence the commutation losses, may include: slew rate, gate current value, gate current shape, gate voltage, dead-time, over-current protection limitation, and over-temperature threshold according to the application. To minimize the commutation losses, one or several of these parameters can be adapted to the actual phase current, resulting in the current of the commutation. For a higher current value, a faster switch may be beneficial regarding the losses. On the other hand, a faster switching may lead to higher noise effects (EMI) that should be avoided. At the end, there is always a compromise between commutation losses and EMI behavior. In the example of system 120, and other example systems in this disclosure, controller 122 may send both switching signals and communication signals, which may include configuration parameters, over the same signal lines.

Using the same signal lines, e.g., the same electrical connections for both switching and communication, may provide advantages compared to other example systems that use separate wiring (including additional pins/pads) from controller 122 to the HS and LS gate driver circuitry 124 for parameter configuration and for switching commands. Some example advantages include reduced complexity, fewer traces on a printed circuit board that may act as EMI antennae such with fast slew rate signals, and reduced cost.

Figure 2:
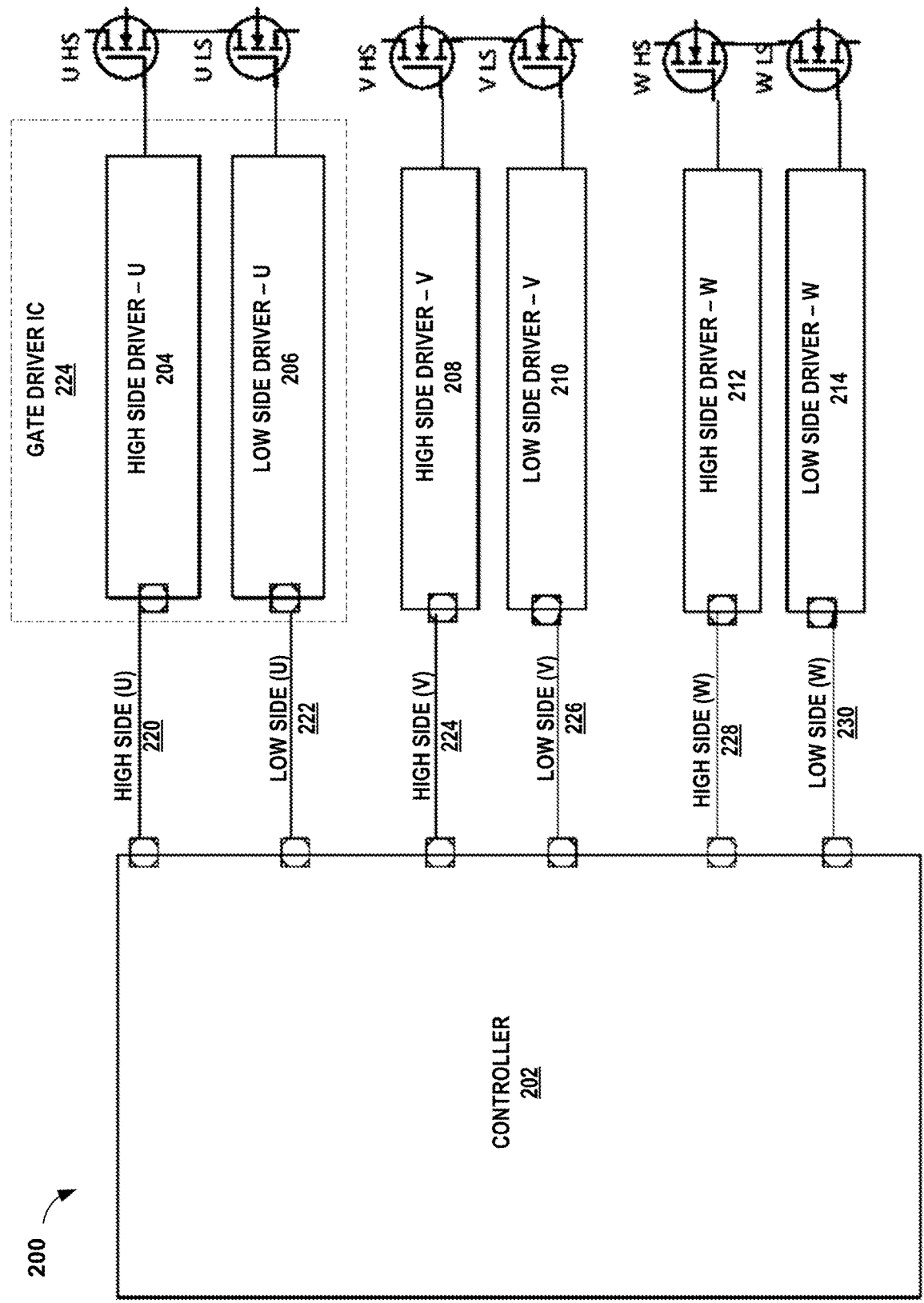
FIG. 2 is a block diagram illustrating an example three-phase system of this disclosure.

FIG. 2 is a block diagram illustrating an example three-phase system of this disclosure. System 200 is an example of systems 100 and 120 described above in relation to FIGS. 1A and 1B. System 200 includes controller 202, which is a circuit that has the same or similar functions and characteristics as described above for controllers 102 and 122.

In the example of FIG. 2, system 200 also includes MOSFET power switches, although the description may apply to any type of power switch. In some examples, system 200 may include a separate driver circuit for each power switch. Each driver circuit may receive command signals from controller 202 and output drive signals to each respective power switch, which, in the example of FIG. 2, are gate drive signals. Each driver circuit may also output communication signals, e.g., status, error messages and similar messages to controller 202.

In other examples, a high-side driver and a low-side driver may be combined on a single integrated circuit. For example, gate driver IC 224 may include high-side driver 204 and low-side driver 206. Gate driver IC 224 may include two input terminals, a first terminal for receiving for high-side switch commands 220 and a second terminal for receiving low-side switch commands 222. Gate driver IC 224 may also include two output terminals, one for the HS switch and one for the LS switch.

As described above in relation to FIGS. 1A and 1B, controller 202 may output both switching commands and send and receive communication through the same signal line and two the same input terminal on a gate driver. For example, HS driver circuit 208 includes an input terminal connected to controller 202 that may receive both switching signals and communication signals via high-side connection 224. In some examples communication signals may include configuration information as described above in relation to FIG. 1B. Configuration information may include one or more configuration parameters for operating the power switches, such as slew rate, gate voltage and other configuration parameters. HS driver 208 may also send signals to controller 202 via high-side connection 224.

Similarly, and as with gate driver IC 224 and LS driver 206, LS driver 210 includes an input terminal connected to controller 202 that may receive both switching signals and communication signals via low-side connection 226. HS driver 212 includes an input terminal connected to controller 202 that may receive both switching signals and communication signals via high-side connection 228. LS driver 214 also includes an input terminal connected to controller 202 that may receive both switching signals and communication signals via low-side connection 230. Each respective driver circuit may operate each respective power switch based on the received switching signals and communication signals.

Figure 3:
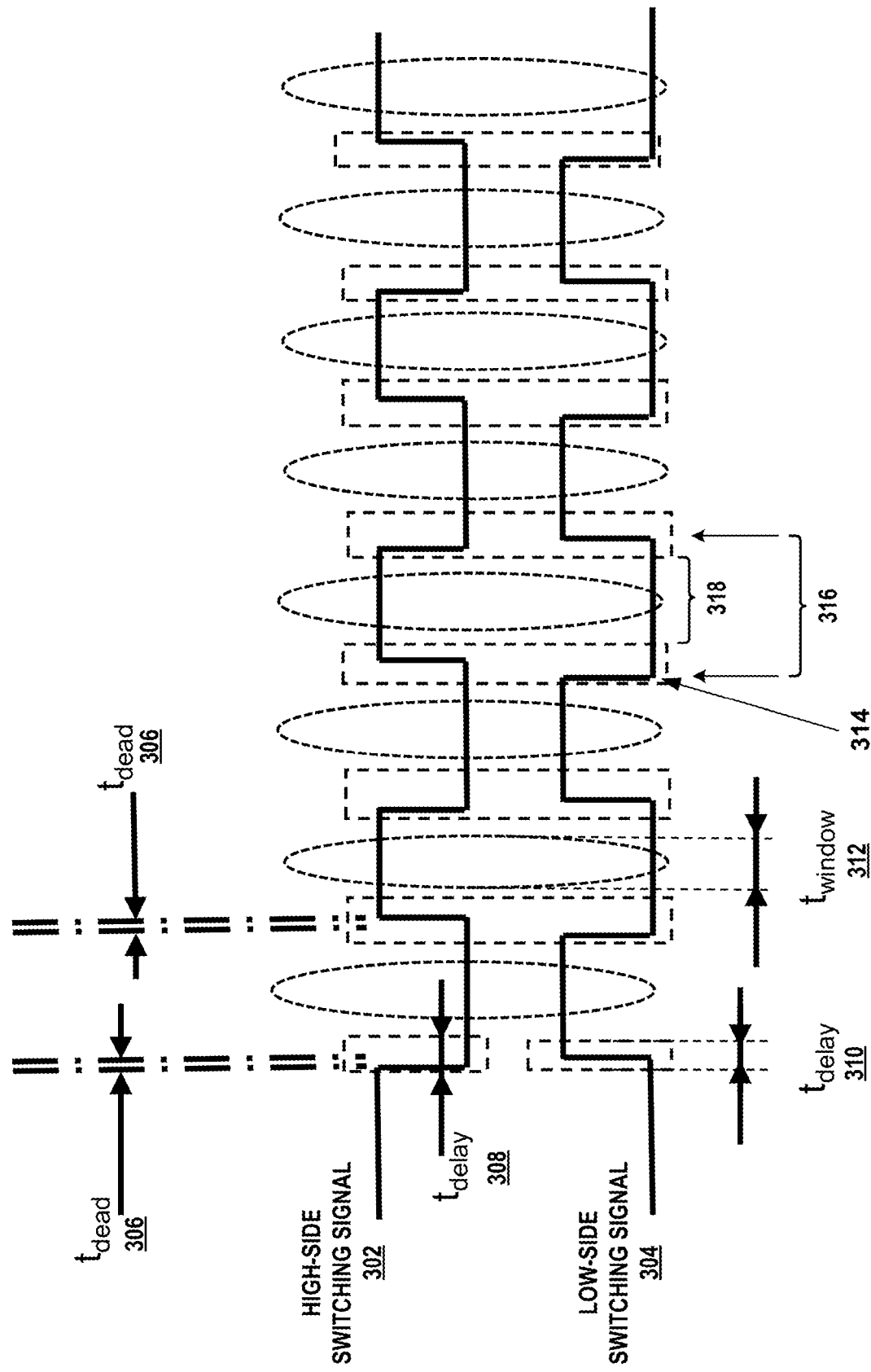
FIG. 3 is a timing diagram illustrating example pulse-modulated switching signals, the associated time delay and communication window for a high-side and low-side power switch circuit.

FIG. 3 is a timing diagram illustrating example pulse-modulated switching signals, the associated time delay and communication window for a high-side and low-side power switch circuit. In other examples, similar timing for switching signals and communication windows may apply to other types of switching circuits beyond half-bridge circuits, such as high-side only, low-side only and other switching circuitry.

In the example of FIG. 3. the control terminal driver switching state changes are initiated by edge transitions of the driver control signal. In the example of MOSFETs and IGBTs, the control terminal is a gate, so the control terminal driver signal is a gate driver signal. In the example of a bipolar junction transistor (BJT) the control terminal is base, so the driver signal would be different from a gate driver signal but may operate in a similar manner with edge transitions as shown in FIG. 3.

The example of FIG. 3 illustrates how a gate driver state transition (from ON to OFF or vice versa) should not be interrupted while the state transition is ongoing, e.g., during $t_{delay}$ 310. After the transition, and for the duration the switch in the state of ON or OFF, the control signal connection of the gate driver can be used to transfer arbitrary data from controller 202 to a gate driver circuit, e.g., high-side driver 204, depicted in FIG. 2, without using any additional communication channel such as additional wiring or connection terminals. For this data transfer any suitable data modulation technique can be used.

In this manner, the core of the disclosure is to use the commutation signal (gate driver control signal) path, which in the example of FIG. 3 is PWM, and add the configuration information (data) via some modulation technique during $t_{window}$ 312. The commutation signal is analyzed in the following way: the rising or falling edge, e.g., edge 314, is transferred with nearly no delay to the "on/off" switching input of the gate driver, e.g., low-side driver 210 of FIG. 2. In parallel a delay time $t_{delay}$ 310 is generated by the driver circuitry. After this delay a time window, $t_{window}$ 312, for a valid configuration data is generated. In some examples, during $t_{window}$ 312, the edge detection of the driver circuitry is disabled, and the on/off signal is held to the previous state (e.g., ON or OFF). In some examples the dead-time, $t_{dead}$ 306 may affect the length of $t_{delay}$ 308 and of $t_{window}$ 312.

In other words, after receiving a switching signal, such as falling edge 314, the driver circuit may output and hold the received switching signal to the associated power switch for a first duration 316. In the example of FIG. 3, after falling edge 314, the driver circuit may output and hold the low-side switching signal 304 to the low-side switch. In some examples falling edge 314 may turn the low-side switch OFF. In other examples falling edge 314 may turn the low-side switch ON. In this disclosure, the "switching signal" may also be referred to as a switch control signal or a commutation signal to distinguish from the communication signal, which may travel on the same signal pathway.

During a second duration 318, the driver circuit may maintain the switching signal triggered by falling edge 314, where to maintain the switching signal, the driver circuit may disable detection of a subsequent switching signal for the second duration 318. The second duration 318, starts and ends within the first duration 316, and may include the window of length $t_{window}$ 312. In some examples, the second duration 318 and $t_{window}$ 312 are the same duration. The driver circuit may allow decoding of the received communication signal received at the input terminal to the driver circuitry during the window. Disabling detection of a subsequent switching signal may allow communication signals, that may appear to be similar to a switching signal, from inadvertently causing the switch to commutate.

To summarize, the circuit arrangement and circuit operation of this disclosure may overlay a main function signaling (PWM switching signal in the example of FIG. 3) and a secondary function signaling, e.g., a communication signal comprising configuration information (not shown in FIG. 3). The main function signaling has "main windows," e.g., the timing intervals shown by $t_{delay}$ 308 and $t_{delay}$ 310, where an information is considered being related to the main function. In some examples, the time delay duration ($t_{delay}$ 308) for the HS switching signal 302 may be different from the time delay duration ($t_{delay}$ 310) and the LS switching signal 304 may be different. In the example of FIG. 3, the 'information related to the main function' is switching commands indicated by rising and falling edges.

The main function signaling timing also has "empty windows," e.g., the second duration 318 and $t_{window}$ 312, where an information received at the driver circuitry input terminal cannot be related to the main (switching) function. These empty windows of the main function signaling can be used for secondary function signaling, e.g., in a modulated communication signal. The circuitry that executes the main function may interpret a modulated signal in the empty window (318) as noise and ignore it, whereas the secondary function circuitry can interpret that modulated signal as data and react on it, e.g., decode configuration information in the communication signal and set behavior for the power switch driver circuitry. In this manner, the circuitry for both the primary function (switching) and the secondary function (communication) may distinguish between main windows and empty windows. The circuit operation of this disclosure may be characterized as a kind of time-division multiple access (TDMA) scheme, but where the access windows are not distributed with respect to time, rather with respect to events.

With the techniques of this disclosure, it is possible to use only one signal path and one input terminal for commutation and for configuration transfer from the controller to the gate driver. That is, an additional signal path for configuration transfer can be avoided, and the wiring effort and pin count of a gate driver IC may be reduced, when compared to other techniques.

Figure 4:
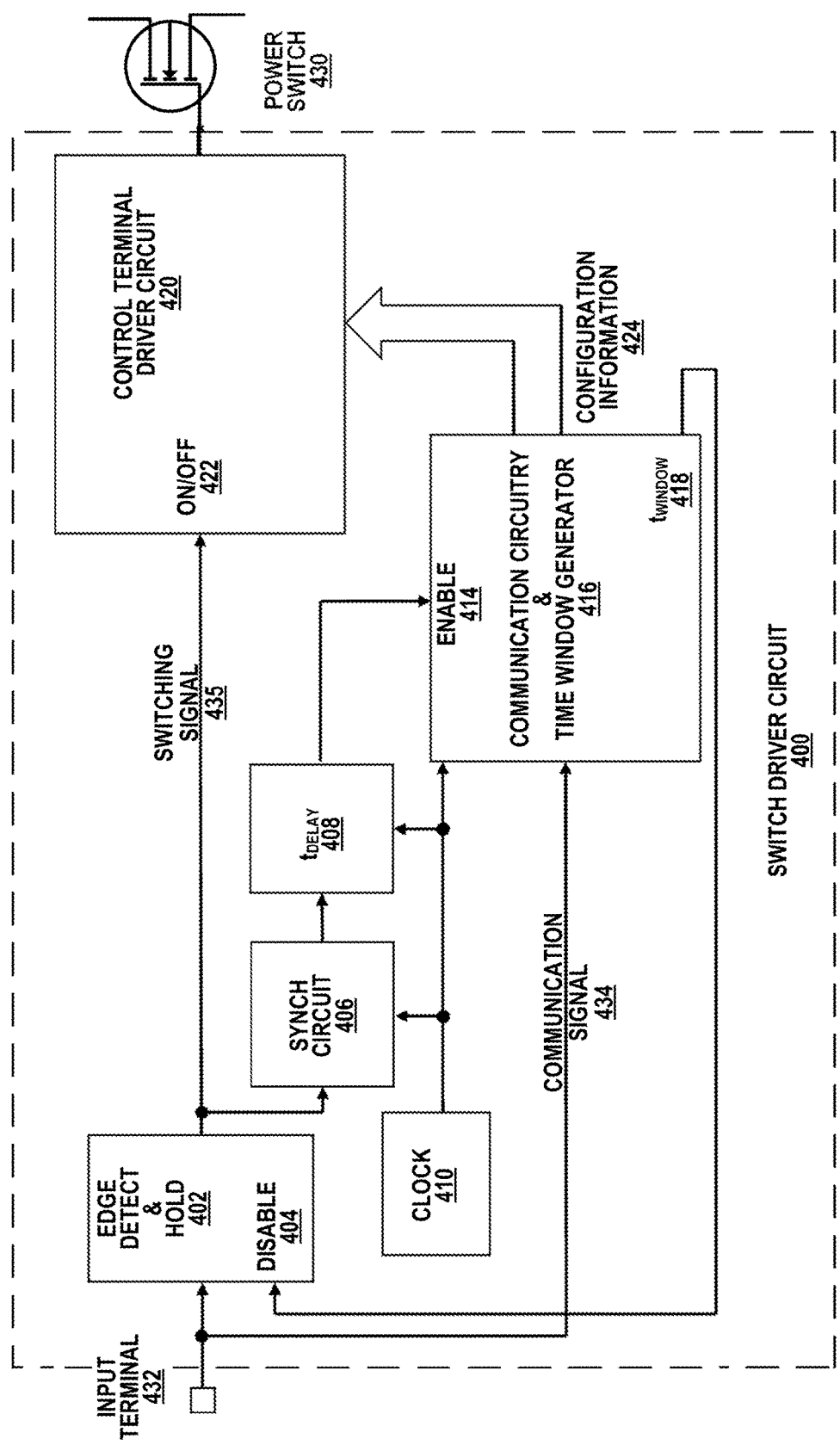
FIG. 4 is a block diagram illustrating an example arrangement of circuitry to implement power switch driver circuitry according to one or more techniques of this disclosure.

FIG. 4 is a block diagram illustrating an example arrangement of circuitry to implement power switch driver circuitry according to one or more techniques of this disclosure. Switch driver circuit 400 is an example of driver circuitry 104 and gate driver circuitry 124 described above in relation to FIGS. 1A and 1B, as well as any of high-side drivers 204, 208, 212 and low-side drivers 206, 210, 214 described above in relation to FIG. 2. Switch driver circuit 400 may have the same or similar functions and characteristics as the driver circuitry described above.

In the example of FIG. 4, switch driver circuit 400 includes control terminal driver circuit 420, communication circuitry and window generator 416, edge detect and hold circuit 402, synch circuit 406, $t_{delay}$ circuit 408, clock 410, input terminal 432 and an output terminal connected to the gate (control terminal) of power switch 430. The arrangement of switch driver circuit 400 in FIG. 4 is just one example implementation and used to describe the techniques of this disclosure. In other examples, switch driver circuit 400 may have a different arrangement and more or fewer components.

Switch driver circuit 400 is power switch driver circuitry that includes input terminal 432, which may connect to a controller, such as controller 202 of FIG. 2. Edge detect and hold circuit 402 (detection circuit 402 for short) may be configured to receive a switching signal from input terminal 432 and output and hold the received switching signal. In the example of FIG. 4, detection circuit 402 may output and hold switching signal 435 to power switch 430 for a first duration, via control terminal driver circuit 420. For example, as described above in relation to FIG. 3, detection circuit 402 may detect falling edge 314, then output and hold the commutation signal (ON or OFF) to power switch 430 for duration 316. As noted above in relation to FIG. 3, in this disclosure the signal from controller 202 of FIG. 2 that commands power switch 430 to turn ON or OFF and received at input terminal 432 may be referred as a switch control signal, a commutation signal or a switching signal in this disclosure. In some examples, the hold circuitry of detection circuit 402 may include a flip-flop, or other similar circuit arrangement, configured to hold the commutation signal, i.e., the switching signal or main function signal, as described above (not shown in FIG. 4).

In the example of FIG. 4, control terminal driver circuit 420 may include buffers, amplifiers, level shifters, galvanic isolation, and other components to apply the proper control terminal signal to operate power switch 430. For example, control terminal driver circuit 420 may apply Vgs, in the example of the MOSFET depicted in FIG. 4, to control the switching of power switch 430. In other examples, control terminal driver circuit 430 may apply base current, Vbe, Vgc (for IGBT), at the proper setting to operate power switch 430 for example, depending on the type of power switch and whether the power switch is a high-side or a low-side switch. Control terminal driver circuit 420 may receive the switching signal at ON/OFF terminal 422 and configuration information 424 at a different terminal or terminals. The configuration information may set the behavior for control terminal driver circuit 420, and behavior for other components of switch driver circuit 400. As described above in relation to FIG. 1B, some examples of configuration information may include slew rate, gate voltage profile, dead-time, over temperature threshold and similar parameters.

Communication circuitry and time window generator 416 may include a configuration decoding circuit, which may receive communication signal 434 from input terminal 432 and decode the received communication signal. The communication signal, e.g., from a controller described above in relation to FIGS. 1A-2, may include status queries, configuration information and other data. The configuration decoding circuit may output configuration information 424 decoded from the communication signal, e.g., to control terminal driver circuit 420, and to other components of switch driver circuit 400 (not shown in FIG. 4 to simplify the diagram).

Communication circuitry and time window generator 416 may also include a time window generation circuit, which, as described above in relation to FIG. 3, may maintain the switching signal from the detection circuit during the second duration comprising a window (e.g., duration 318 and $t_{window}$ 312 of FIG. 3). In this disclosure, to "maintain" the switching signal may include disabling detection of a subsequent switching signal and allow decoding of the received communication signal during the window.

In the example arrangement of FIG. 4, communication circuitry and time window generator 416 may output a command from $t_{window}$ 418 to disable terminal 404 of detection circuit 402. In this manner, during the window ($t_{window}$ 312) within second duration 318, detection circuit 402 may ignore any fluctuation in the signal at input terminal 432, e.g., as noise, and will not cause power switch 430 to commutate to a different switching state. At the same time communication circuitry and time window generator 416 may receive and decode communications from the controller received at the same input terminal 432.

Also, during operation, when detection circuit 402 detects a switching signal, such as a rising edge or falling edge, the output switching signal may cause the combination of clock 410, synch circuit 406 and $t_{delay}$ 408 to initially disable communication circuitry and time window generator 416, e.g., for the duration of $t_{delay}$ 310 depicted in FIG. 3, to allow the switching signal to fully transition and avoid interrupting the main function signal while the state transition is ongoing, as described above in relation to FIG. 3. The expiration of $t_{delay}$ 310 may enable communication circuitry and time window generator 416 via enable 414 in the example of FIG. 4. In this manner, the start and end of the second duration (318 of FIG. 3) is based at least in part on the delay-time $t_{delay}$ 310 correlated to the switching signal. In the example of power switch driver circuitry comprises a high-side driver circuit and a low-side driver circuit, e.g., gate driver IC 224 of FIG. 2, where the switching signal may include a dead-time, then the delay-time and the window duration may be based at least in part on the dead-time, as described above in relation to FIG. 3. As noted above, signal timing from the controller may control the duration of the dead time and delay-time.

Figure 5:
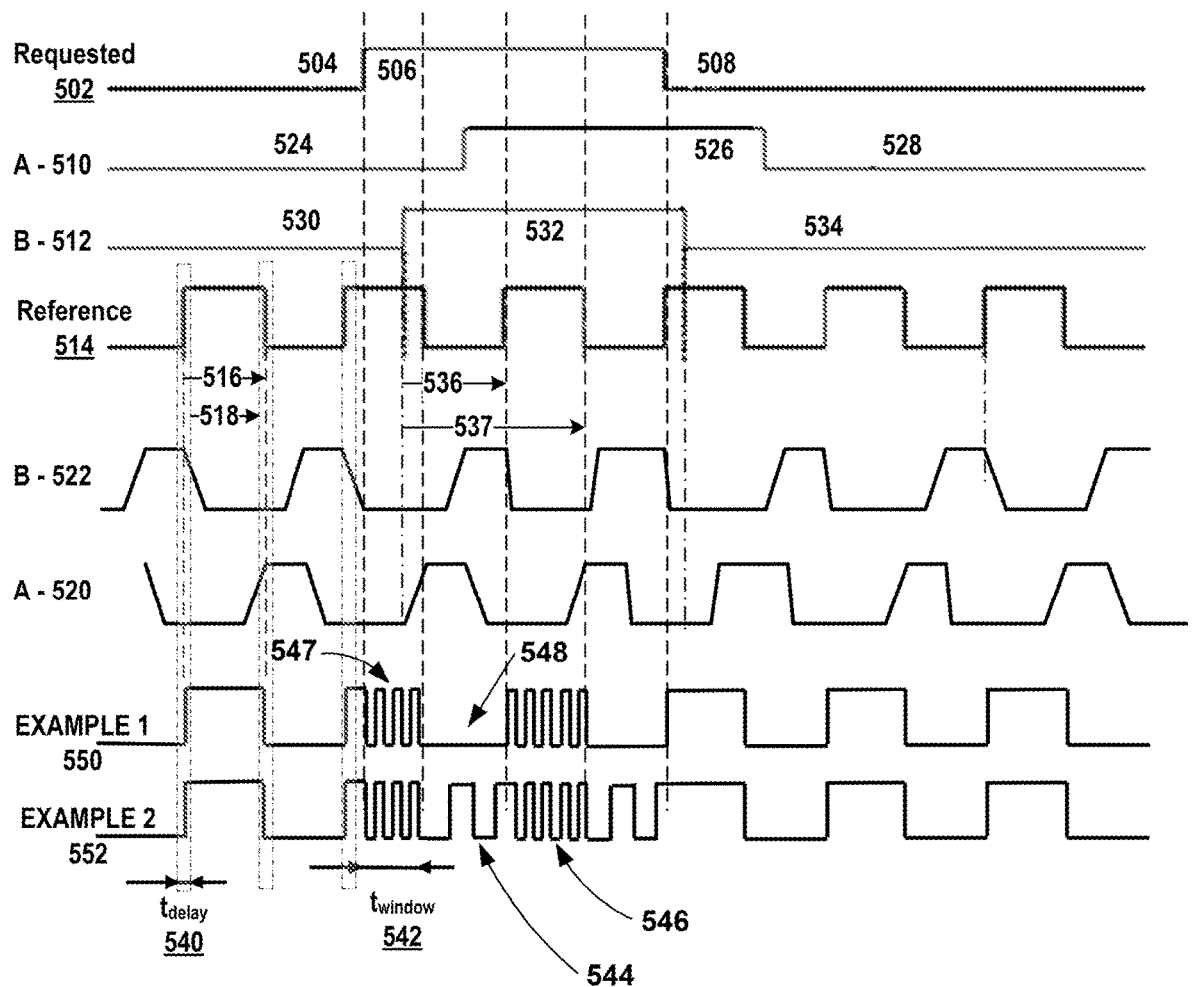
FIG. 5 is a timing diagram chart illustrating an example of sending and implementing configuration information for a power switch driver circuit of this disclosure.

FIG. 5 is a timing diagram chart illustrating an example of sending and implementing configuration information for a power switch driver circuit of this disclosure. In the example of FIG. 5, both the main function switching signal and the secondary function communication signal use PWM for modulation, which may include one or more duty cycles. In other examples, the modulation scheme for the main function may differ from the secondary function, e.g., PWM and PFM, or some combination of modulation schemes. The example of FIG. 5 illustrates applying the PWM communication for slew rate control and includes some timing logic for safe switching of the half-bridge, e.g., to ensure that the power rail does not short to the ground rail by inadvertently turning ON both the HS and LS switch.

FIG. 5 illustrates two different examples for changing between a fast slew rate and a slower slew rate to operate the power switches. Example 1 550, depicts the presence 547, or absence 548 of a higher frequency PWM communication signal superimposed on the switching during the "empty window." Example 2 550 depicts shifting from a high frequency 546 PWM communication signal to a lower frequency 544 PWM communication signal during $t_{window}$ 542 to switch between different slew rate settings.

Reference PWM signal 514 includes a fast superimposed communication signal (547 or 546) from a controller connected to the input pin to set the slew rate to fast switching. The fast switching is not immediately applied, but in a way that the fast off switching 536 is applied immediately after the higher frequency signal (547 or 546) is applied, but the fast on slew rate 537 is applied later, e.g., one PWM cycle later. The same is done for the removal of the high frequency communication signal: the slow switching is immediately applied to the on switching but delayed for the off switching. With this scheme, it is ensured that no overlapping switching can occur, and the switching is done in a safe way.

The requested switching behavior timing 502, shows a slow slew rate setting 504, followed by a requested fast slew rate 506 and back to the slow slew rate setting 508. The applied slew rate timing for driver A 520, shown by 510 indicates slow slew rate 524, followed by a period 526 with fast off applied immediately and fast on delayed. A period 528 with slow slew rate may be applied immediately and slow off delayed. Similarly, for driver B 522, the applied switching slew rate behavior shown by 512 begins with 530, at a slow slew rate, followed by 532 with fast off applied immediately and fast on delayed. Finally, period 534 with slow on applied immediately with slow off delayed.

Due to these delays, it can be seen that the slow slew rate switching driver signals are applied after a complete PWM cycle without the communication signal for each driver. To detect the PWM signal correctly the communication signal may have a higher frequency than the turn on time of the driver switching signals, e.g., related to the Miller plateau. The Miller plateau (Vpl) may refer to the gate-source voltage when dVgs/dt is at a minimum. This voltage plateau (Vpl) may be described as the region when the transistor is switching from the OFF state to the ON state.

The communication for the circuits of this disclosure may be limited by the time $t_{window}$ 542, as the communication should to fit into this time, as described above in relation to FIG. 3 (at least one high low transition for indicating the switching speed change in this example). The communication window, $t_{window}$ 542 starts after $t_{delay}$ 540 and may be limited by the lowest commutation duty cycle that is allowed for a particular application.

In some examples, the safe switching behavior may be programmed into the power switch driver circuitry, e.g., controlled by logic in control terminal driver circuit 420, communication circuitry and window generator 416, edge detect and hold circuit 402 of switch driver circuit 400 described above in relation to FIG. 4. Additionally, or alternatively, safe switching may be controlled by the transmitter, e.g., controller 102 and 122 of FIGS. 1A and 1B, and not only programmed into the receiver, e.g., the power switch driver circuitry. In other words, the controller may be configured control the amount of time for the first duration 516, to output and hold the switching signal and control the amount of time for the second duration 518, which includes the communication window $t_{window}$ 542. In some examples, the controller may extend the second duration 518 and the window $t_{window}$ 542 for decoding the communication signal and delay sending the commutation signal (rising or falling edge in the example of FIG. 5) as needed. For example, the controller may need more time to output configuration information for some next phase of operation. The durations 516 and 518 correspond to durations 316 and 318 described above in relation to FIG. 3.

Figure 6:
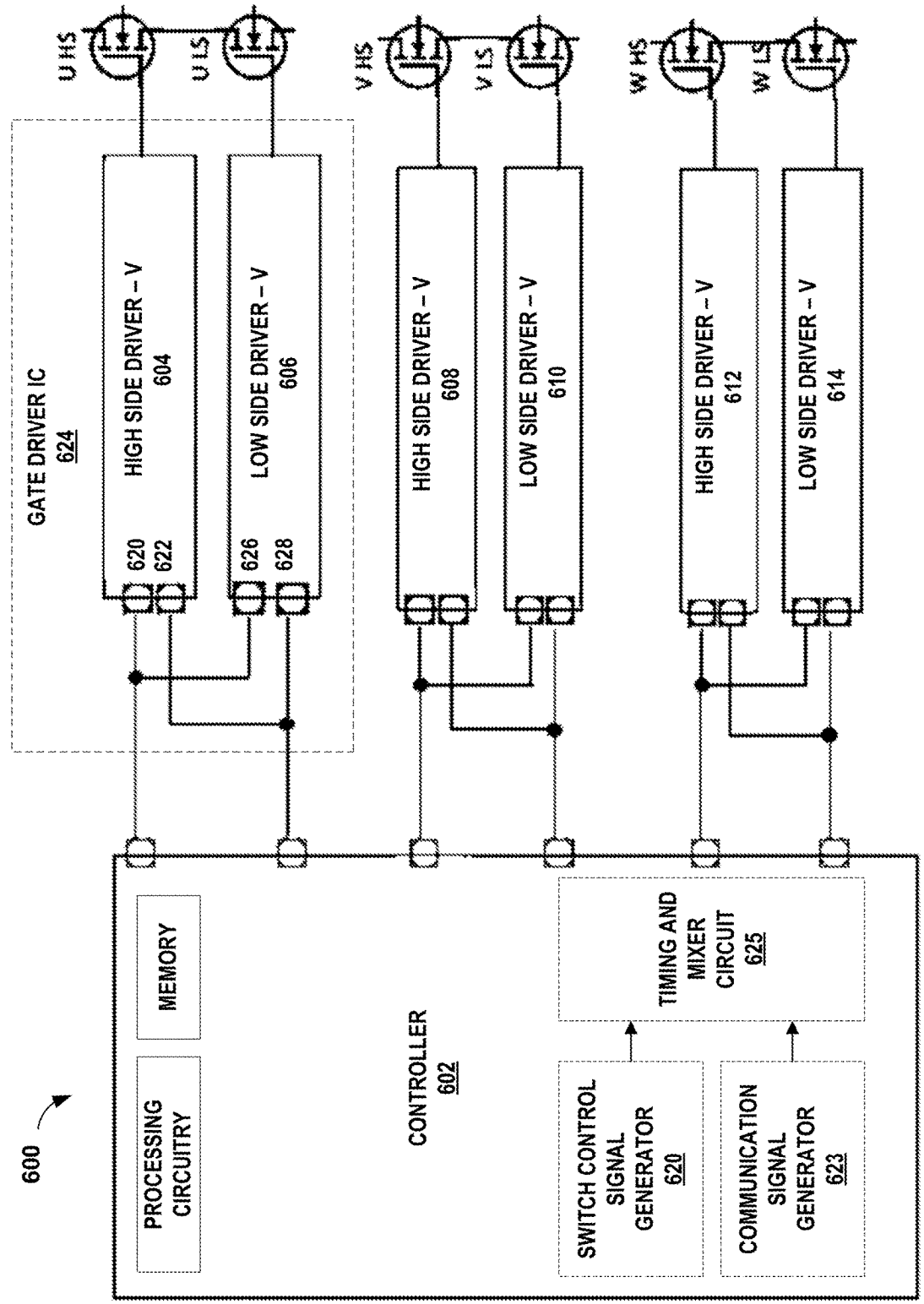
FIG. 6 is a block diagram illustrating an example three-phase system of this disclosure with shoot-through protection.

FIG. 6 is a block diagram illustrating an example three-phase system of this disclosure with shoot-through protection. The example of system 600 is similar to the example of system 200 of FIG. 2, with the addition of a second input terminal for each power switch driving circuit. Shoot-through protection (STP) applies to switching circuits like half-bridge switching circuits in which there is a risk that by unintentionally switching ON two switches at the same time, the power rail may short to the reference or ground rail. In other words, the switching signals from the controller include both a high-side switching signal and a low-side switching signal, as described above in relation to FIG. 3.

In the example of FIG. 6, controller 602 is an example circuit that may output both switching and communication signals to input terminal 620 of high-side driver 604. The switching/communication signals to high-side driver 604 may also connect to second input terminal 626 of low-side driver 606. Similarly, controller 602 may output both switching and communication signals to input terminal 628 of low-side driver 606. The switching/communication signals to low-side driver 606 may also connect to second input terminal 622 of high-side driver 604.

In the example of FIG. 6, controller 602 includes processing circuitry operatively coupled to a memory that may execute the functions described in this disclosure, along with many other functions not described. Controller 602 may also include circuitry such as switch control signal generator 620, communication signal generator 623 and timer and mixer circuit 625, which may all be controlled by processing circuitry of controller 602, in some examples. In other examples, any one or more of switch control signal generator 620, communication signal generator 623 and timer and mixer circuit 625 may be operatively connected within system 600 but separate from controller 602 (not shown in FIG. 6). Timer and mixing circuit 625 may receive the switching control signals to turn ON and OFF the power switches of system 600, and also receives communication signals, such as configuration information for the power switch driver circuits. Timer and mixing circuit 625 may control the timing of the switch control signals, e.g., rising and falling edges, and insert modulation on the same signal pathway for the communication. As described above, system 600 is an example of systems 100, 120, and 200 described above. Therefore, though not shown in FIGS. 1-4, systems 100, 120, and 200 as well as controller 102, controller 122 and controller 202 may include the same or similar arrangements and options as the arrangement of system 600 described above.

In addition to providing STP, the input signal received at the second input terminal of each respective driver circuit may control the second duration, e.g., 518 of FIG. 5 that includes the communication window. The STP is based on the fact that both PWM signals (for LS and for HS) are cross connected between the LS and the HS gate drivers. For example, for HS driver 604, the input signal, i.e., the switching signal for LS driver 606, received at second terminal 622 acts as the STP input. If the switching signal at both the first input terminal 620 and at the second input terminal 622 are active, e.g., indicating that the switch should be ON, then logic within HS driver 604 "knows" that there is a failure somewhere. For both input signals to indicate ON would be a failure because both switches ON would result in a short circuit. Therefore, logic within HS driver 604 would prevent activation (turn ON) of the HS switch that had been deactivated (turned OFF) before the STP condition was detected (both switching control signals indicating ON). In the example in which the HS switch was switched ON before the STP condition, then the logic of HS driver 604 may cause the HS switch to stay ON, in some examples. In such a state, the state of the half-bridge may seem to be "frozen", although some information may have been signaled by modulated communication data to or from the input terminals.

As described above in relation to FIG. 2, in some examples, each power switch driver circuit may be an independent unit, e.g., a separate integrated circuit. In other examples, the high-side driver circuit and low-side driver circuit may be arranged as a single unit, as depicted by gate driver IC 624. For the single IC example, the cross connection of the STP signals may be located on gate driver IC 624. In the example of separate power switch driver circuits, e.g., as shown by driver circuits 608, 610, 612 and 614, the cross connection may be located on a printed circuit board, lead frame or some similar structure.

Figure 7A:
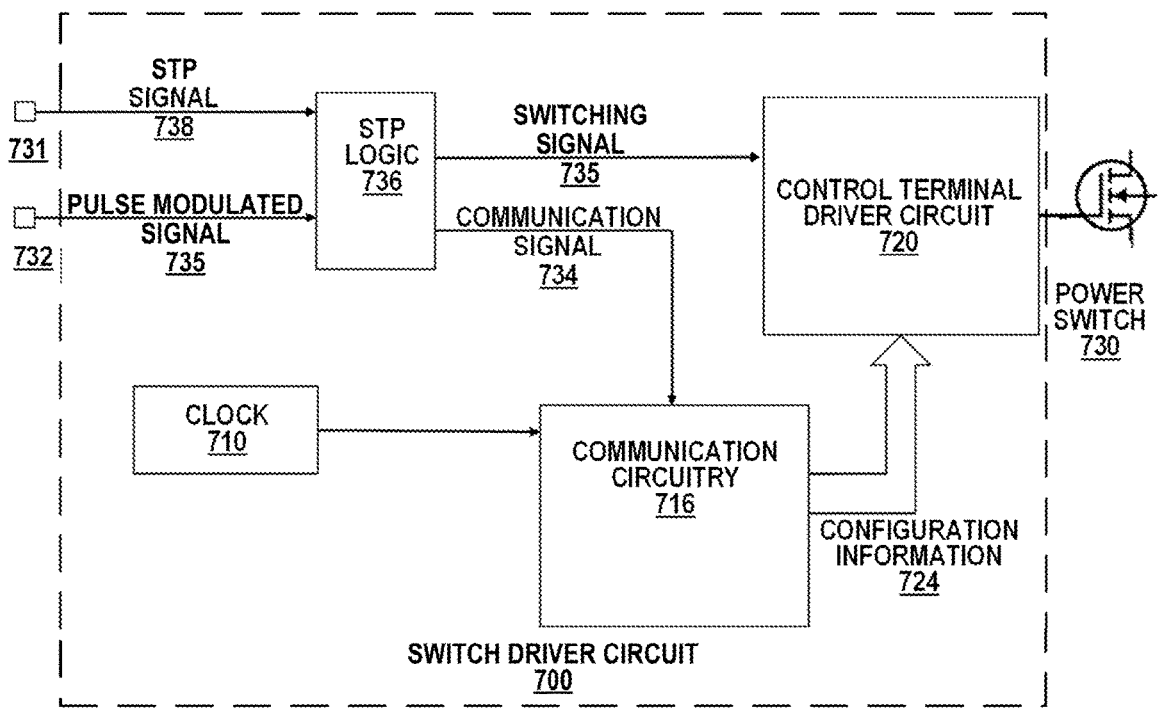
FIG. 7A is a block diagram illustrating an example arrangement of circuitry to implement power switch driver circuitry with an STP signal according to one or more techniques of this disclosure.

FIG. 7A is a block diagram illustrating an example arrangement of circuitry to implement power switch driver circuitry with an STP signal according to one or more techniques of this disclosure. FIG. 7A illustrates one possible example of the internal arrangement of any one of the power switch driver circuits depicted in FIG. 6, such as low-side driver 610. As described above in relation to FIG. 4, in other examples, switch driver circuit 700 may have a different arrangement and more or fewer components.

In the example of FIG. 7A, power switch driver circuit 700, similar to power switch driver circuit 400 described above in relation to FIG. 4, includes control terminal driver circuit 720, communication circuitry 716, clock 710, input terminal 732 and an output terminal connected to the gate (control terminal) of power switch 730, which may have the same functions and characteristics as similar components described above in relation to FIG. 4. Power switch driver circuit 700 also includes shoot through protection logic, STP logic 736 and a second input terminal 731 configured to connect to STP signal 738. In the example of FIG. 7A. STP logic 736 may perform some of the functions of edge detect and hold circuit 402 described above in relation to FIG. 4. In other examples, switch driver circuit 700 may not use edge detection to detect the commutation command in pulse modulated signal 735. In some examples, STP signal 738 may be the control terminal signal for the opposite switch in a half-bridge switching circuit. For example, when power switch 730 is a high-side switch, STP signal 738 may connect to the control terminal signal for the associated low-side switch. In other examples, STP signal 738 may be a separate signal from a controller or other circuitry in a system.

To simplify the description, the operation of switch driver circuit 700 will be described as though configured as a low-side driver. Similar to the description above in relation to FIGS. 3 and 4, in some examples, STP logic 736 may detect the low-side switching signal falling edge 314, then output and hold switching signal 735 (ON or OFF) to power switch 730 for duration 316. In the example of FIG. 7A, switching signal 735 is an output from STP logic 736 sent to control terminal driver circuit 720 to reach power switch 730. In the example in which pulse modulated signal 735 at first input terminal 732 is a command to turn ON power switch 730, then if STP signal 738 indicates that the high-side switch associated with power switch 730 is also ON, then STP logic 736 may prevent the ON command from reaching power switch 730 which will prevent both the LS and HS switches from being ON (active) at the same time. Otherwise, STP logic 736 may detect when STP signal 738 has toggled indicating that the HS switch has changed state, and output and hold switching signal 735 to control terminal driver circuit 720 to turn ON, or turn OFF, power switch 730.

For communication, the system of this disclosure, e.g., controller 602 or other component of system 600 of FIG. 6, may keep the PWM signal of the active switch for the half-bridge circuit on active level (ON) and modulate information on the inactive (OFF) PWM signal. The STP logic for the inactive driver circuit may keep the associated switch deactivated (OFF) and communication circuitry for the inactive switch may receive and decode communication. The system controller may stop communication modulation during certain portions of the switching cycle. For example, during switch transition times or during dead time when both PWM signals are at inactive level to switch both the HS and LS switches OFF. However, as soon as one of the LS or HS switches are activated (ON) via one PWM signal, then the other PWM signal may be used for communication.

For switch driver circuit 700 as a low-side switch driver, during the time that the second switching signal, STP signal 738, at second terminal 731 indicates that the high-side switch for the half-bridge circuit is ON (and power switch 730 is OFF) STP signal 738 may cause STP logic 736 to enable the communication window for the low-side driver circuit. For example, STP logic 736 may output communication signal 734 and enable communication circuitry 716 to receive and decode communication received at input terminal 732. At the same time, STP logic 736 may hold power switch 730 in the OFF state (deactivated) via control terminal driver circuit 720.

Figure 7B:
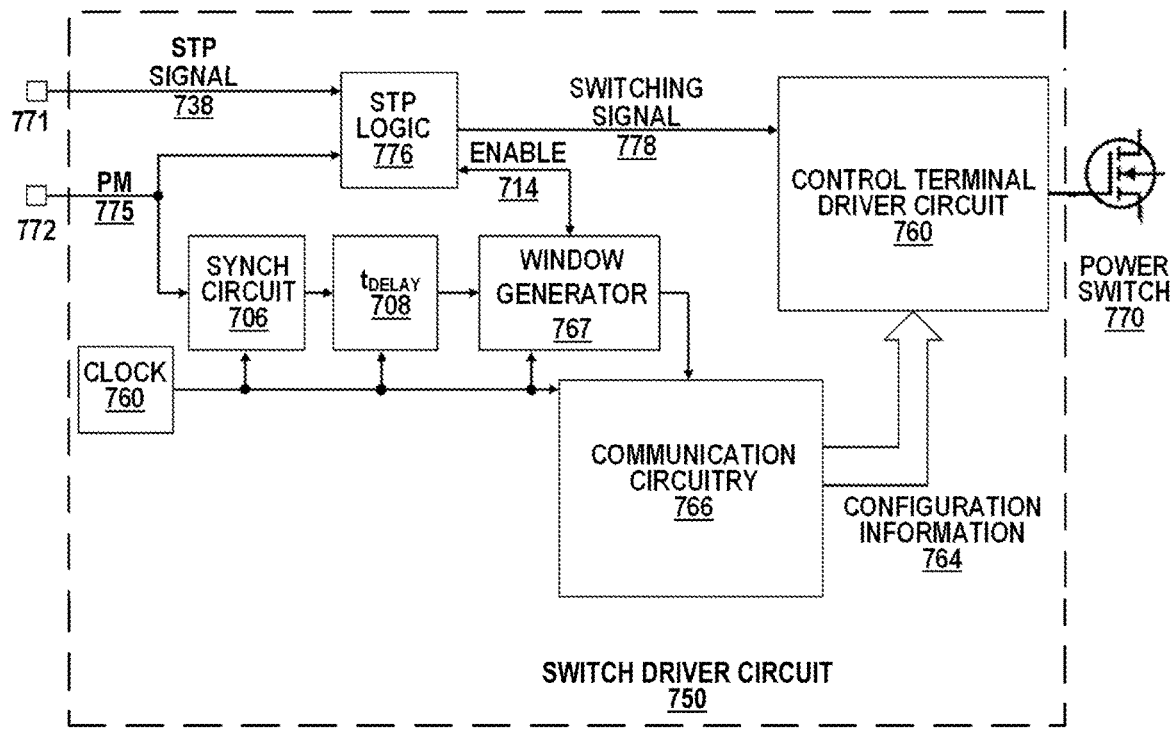
FIG. 7B is a block diagram illustrating an example arrangement of circuitry to implement power switch driver circuitry with a combined STP signal and window generator according to one or more techniques of this disclosure.

FIG. 7B is a block diagram illustrating an example arrangement of circuitry to implement power switch driver circuitry with a combined STP signal and window generator according to one or more techniques of this disclosure. Switch driver circuit 750 is an example of the internal arrangement of any one of the power switch driver circuits depicted in FIG. 6, such as low-side driver 610. The example of FIG. 7B may include features from FIG. 7A combined with features described above in relation to FIG. 4. The components of FIG. 7B may have the same or similar functions to components described above. For example, synchronization circuit 706 and communication circuitry 766 and window generator 767, may be examples of detection circuit 402, synchronization circuit 406 and communication circuitry and window generator 416 of FIG. 4 and have the same or similar characteristics.

In some examples of operation, switch driver circuit 750 may communicate with the system controller based on enable 714 from STP logic in first mode at a first time and communicate in a second mode based on using $t_{delay}$ 708 and window generator 767, at a second time. In the first mode of operation, switch driver circuit 750 may function as described above for switch driver circuit 700. That is, for communication, the system of this disclosure, e.g., system 600 of FIG. 6, may keep the PWM signal of the active switch for the half-bridge circuit on active level (ON) and modulate information only on the inactive (OFF) PM signal 775 at input terminal 772. The STP logic for the inactive driver circuit may keep the associated switch deactivated (OFF) and communication circuitry for the inactive switch may receive and decode communication received via input terminal 772, synch circuit 706, $t_{delay}$ 708, and window generator 767. In some examples STP logic 776 may enable the communication circuitry to receive and decode communication signals. In this first mode of operation, receiving communication depends on the state of STP signal 738 and power switch 770 is OFF. Then STP logic 776 may output enable signal 714 to window generator 767 as shown in FIG. 7B, or in some examples, directly to communication circuitry 766 (not shown in FIG. 7B) to enable communication circuitry 766 to decode communication signals.

In other examples, switch driver circuit 750 may operate in the second mode of operation, as described above in relation to FIGS. 4 and 5. In this second mode, switch driver circuit 750 may communicate during the "empty windows" whether the associated power switch 770 is OFF or ON. In the example of FIG. 7B, synch circuit 706 may detect a switch control signal in pulse modulated signal 775, such as a rising edge or falling edge. STP logic 776 may output and hold switching signal 778 to power switch 770, if STP signal 738 received at input terminal 771 indicates that power switch 770 may commutate safely, as described above. STP logic 776 may provide additional circuit protection, along with any dead-time and delay-time as described above in relation to FIGS. 3 and 5.

The rising or falling edge may cause the combination of clock 760, synch circuit 706 and $t_{delay}$ 708 and window generator 767 to initially block or disable communication circuitry 766, e.g., for the duration of $t_{delay}$ 540 depicted in FIG. 5. The delay may allow the switching signal to fully transition and avoid interrupting the main function signal while the state transition is ongoing, as described above in relation to FIG. 3. The expiration of $t_{delay}$ 540 may trigger window generator 767 to pass the communication signal received at input terminal 772 to communication circuitry 766 during $t_{window}$ (as shown in FIGS. 3 and 5). In some examples, window generator circuit 767 may also prevent STP logic 776 from responding to signal fluctuations at input pin 772 during $t_{window}$, as described above in relation to FIGS. 3 and 4.

In some examples, in this second mode, window generator 767 may disable switching command (e.g., edge) detection, via enable 714 to STP logic 776. In this manner, the start and end of the second duration (318 of FIG. 3, which may include $t_{window}$ 312 and $t_{window}$ 542 of FIG. 5) is based at least in part on the delay-time $t_{delay}$ 310 correlated to the switching signal.

As noted for switch driver circuit 700, the system controller, as described above for FIG. 6, may control the timing and mixing of pulse modulated signals and communication signals received by switch driver circuit 750 at input terminal 772. Processing circuitry, e.g., of controller 602, or other generation and mixing circuitry of system 600, may stop communication modulation during certain portions of the switching cycle, such as during switch transition times or during dead time when both PWM signals are at inactive level, that is, when both the HS and LS switches are switched OFF.

Figure 8A:
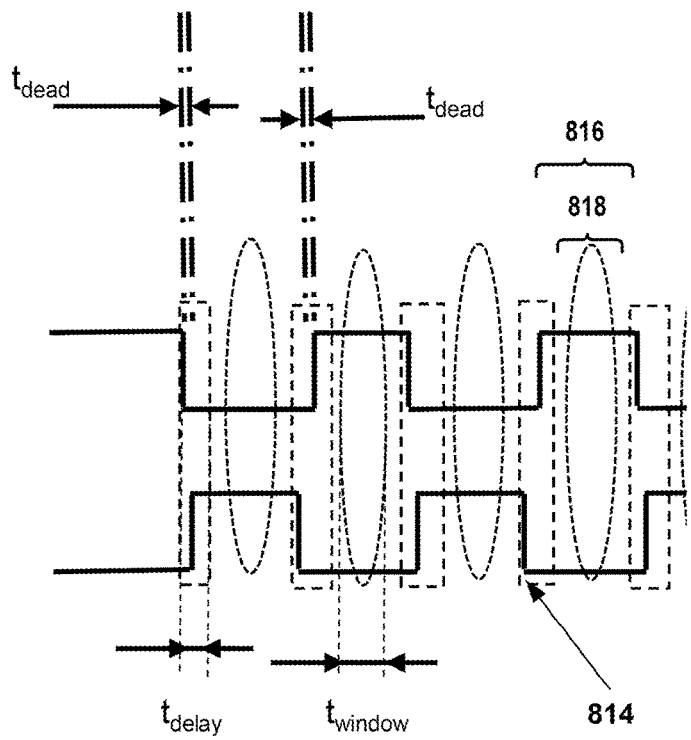
FIGS. 8A and 8B are timing diagrams illustrating example switching signals and communication windows.
Figure 8B:
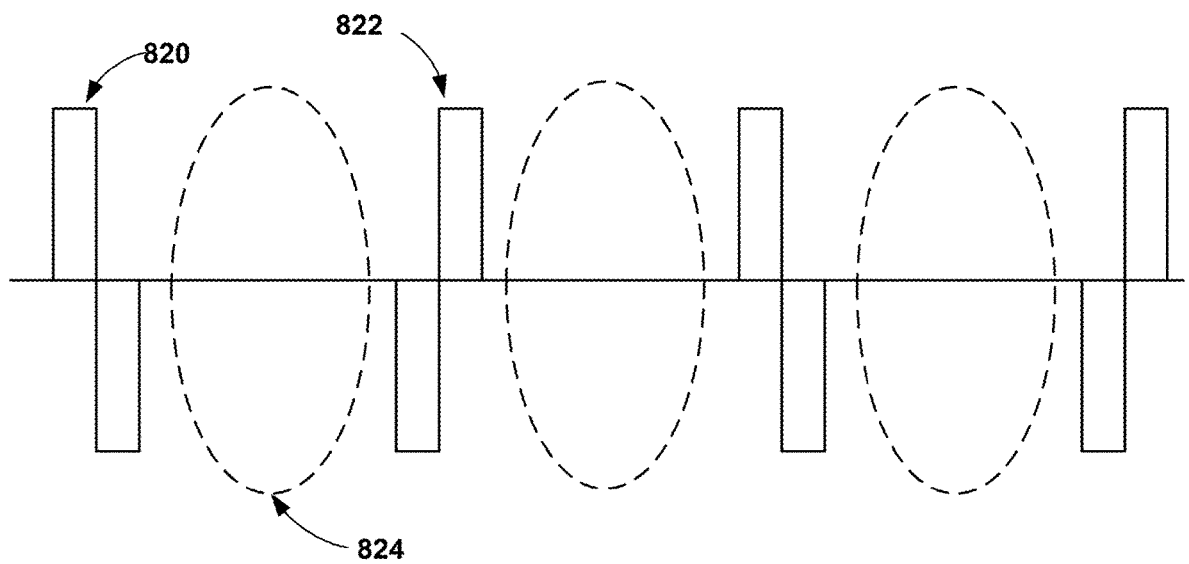

FIGS. 8A and 8B are timing diagrams illustrating examples of switching signals and communication windows. FIG. 8A is similar to FIG. 3, described above and is placed on the same sheet as FIG. 8B for ease of comparison.

In the example of 8A, a switch driver circuit of this disclosure, e.g., switch driver circuit 400 of FIG. 4 or switch driver circuit 750 of FIG. 7B may include a window generation circuit configured to generate communication window with timing based on receiving a switching signal via the input terminal. The duration, as well as the start time and end time of the communication window may be based on the switching signal (rising or falling edge) along with a delay-time. The window generation circuit may maintain the switching signal from the detection circuit during the communication window, where to "maintain" the switching signal comprises disabling the detection circuit, e.g., STP logic 776 of FIG. 7B, to prevent a subsequent edge received at the same input pin from being interpreted as a switching signal 814. During this second duration 818, which starts and ends within the first duration 816 between the switching signals, the communication circuitry may allow decoding of the received communication signal during the window.

Similar to FIG. 8A, the example of FIG. 8B illustrates switching signals 820 and 822 and window of time 824 in which communication signals may be transferred on the same transmission line, e.g., for an isolated switching circuit, such as a switching circuit with galvanic isolation. However, unlike FIG. 8A, the duration of the communication window does not start and end within the duration of the switching signals.

A switching circuit may receive switching (commutation) signal 820, which may cause an associated power switch to commutate (turn ON or turn OFF). Later, the switching circuit may receive a second switching signal 822, which may cause the associated power switch to commutate to the opposite state. During the time indicated by 824, the switching circuit may be configured to send or receive communications. However, neither switching signal 820 or 822 are detected and held for a duration, within which, the communication window starts and stops, in contrast to FIG. 8A.

Figure 9:
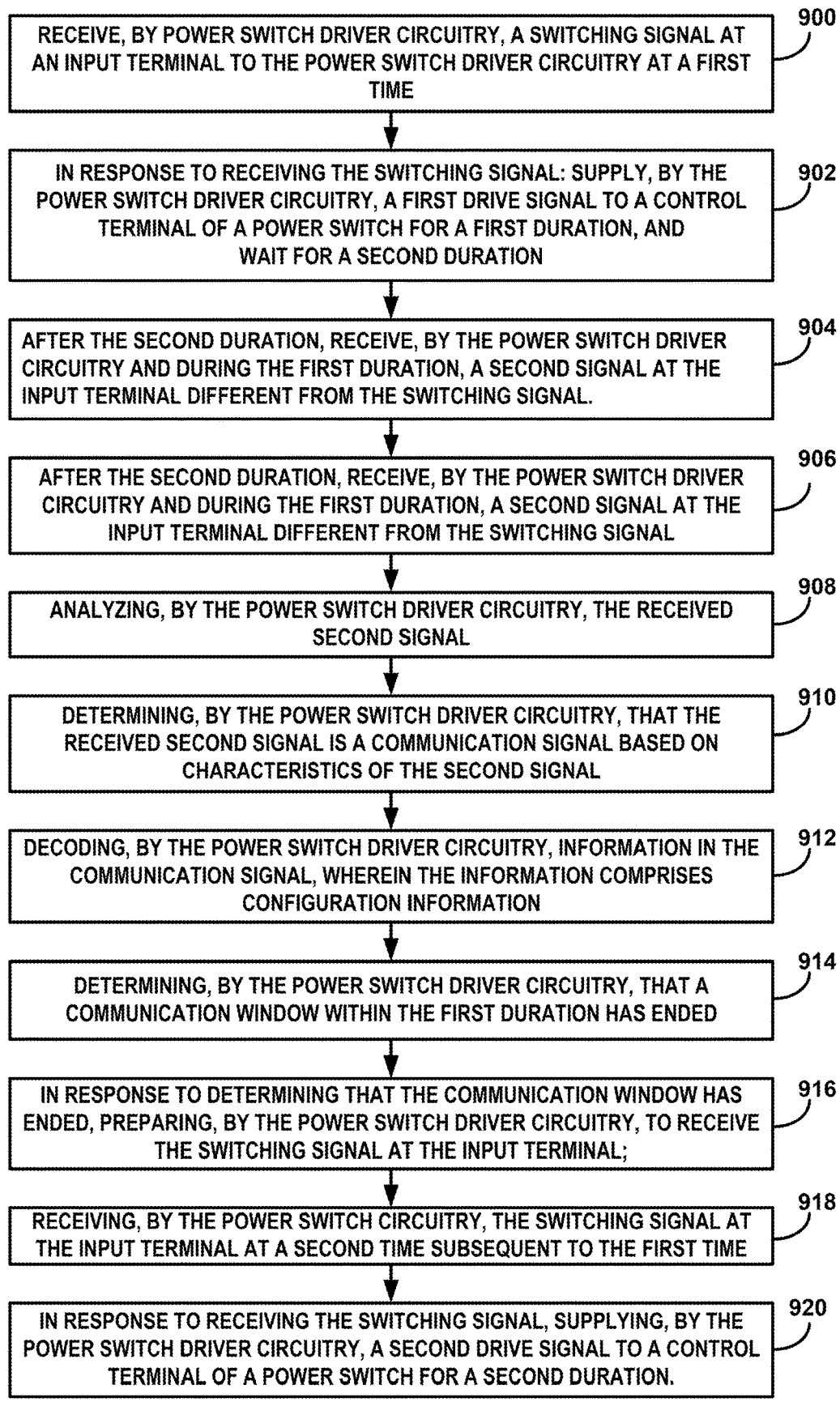
FIG. 9 is a flow chart illustrating an example operation of a power switch driver circuit using timing window generation, according to one or more techniques of this disclosure.

FIG. 9 is a flow chart illustrating an example operation of a power switch driver circuit using timing window generation, according to one or more techniques of this disclosure. The blocks of FIG. 9 will be described in terms of FIGS. 2 and 4, unless otherwise noted.

Power switch driver circuitry, such as switch driver circuit 400, may receive a switching signal at input terminal 432 of the power switch driver circuitry at a first time (900). The switching signal may include a pulse modulated signal, as shown by high-side switching signal 302 and low-side switching signal 304.

In response to receiving the switching signal, supply, e.g., by edge detect and hold circuit 402, a first drive signal to a control terminal of a power switch for a first duration (902). In the example of FIG. 4, edge detect and hold circuit 402 supplies the switching signal to control terminal driver circuit 420, which outputs the switching signal to power switch 430 with the appropriate voltage. The power switch driver circuitry may wait for a second duration, where the second duration is based on circuit characteristics of the power switch and characteristics of the power switch driver circuitry, e.g., slew rate and other parameters set into control terminal driver circuit 420. The second duration in the context of FIG. 9 is different than duration 318 described above in relation to FIG. 3. Instead, the second duration may include a delay-time, which in turn may include dead-time, in the example of power switch driving circuitry for a half-bridge circuit. In the example of power switch driving circuitry for a single switch, delay-time may not need to include dead-time to protect against an inadvertent short circuit between power and ground.

After the second duration, e.g., $t_{delay}$ 310 of FIG. 3, and during the first duration 316, the power switch driver circuitry may receive a second signal, such as a communication signal 434, at input terminal 432 (904). In some examples, the communication signal may have a different modulation scheme from the switching signal.

In some examples, circuitry within switch driver circuit 400, such as communication circuitry within communication circuitry and window generator 416 in some examples, or detection circuit 402 in other examples, may analyze the received second signal (908). For example, the analysis may include determining whether the signal at input terminal 432 is noise, communication, or a switching signal. Based on characteristics of the second signal, the power switch driver circuitry may determine that the received second signal is a communication signal (910), e.g., based on detecting an expected modulation scheme, that the signal is within $t_{window}$, the signal has an expected frequency, is less than a threshold amplitude, e.g., is not caused by EMI, and other characteristics.

Communication circuitry and window generator 416 may decode information in the communication signal (912). In some examples the information includes configuration information, which may set behavior of switch driver circuit 400, or some other information, as described above in relation to FIG. 1.

Communication circuitry and window generator 416 may determine, that a communication window within the first duration has ended, e.g., that the time period $t_{window}$ 312 has expired (914). In response to determining that the communication window has ended the power switch driver circuitry may prepare to receive the switching signal at input terminal 432 (916). As described above in relation to FIGS. 3 and 4, in some examples, communication circuitry and window generator 416 may output $t_{window}$ 418 to detection circuit 402, which may enable detection circuit 402 to detect the next switching signal at input terminal 432.

The power switch circuitry may receive the switching signal at the input terminal at a second time subsequent to the first time (918), and in response to receiving the switching signal, supplying, by the power switch driver circuitry, a second drive signal to a control terminal of a power switch for a third duration (920).

Figure 10:
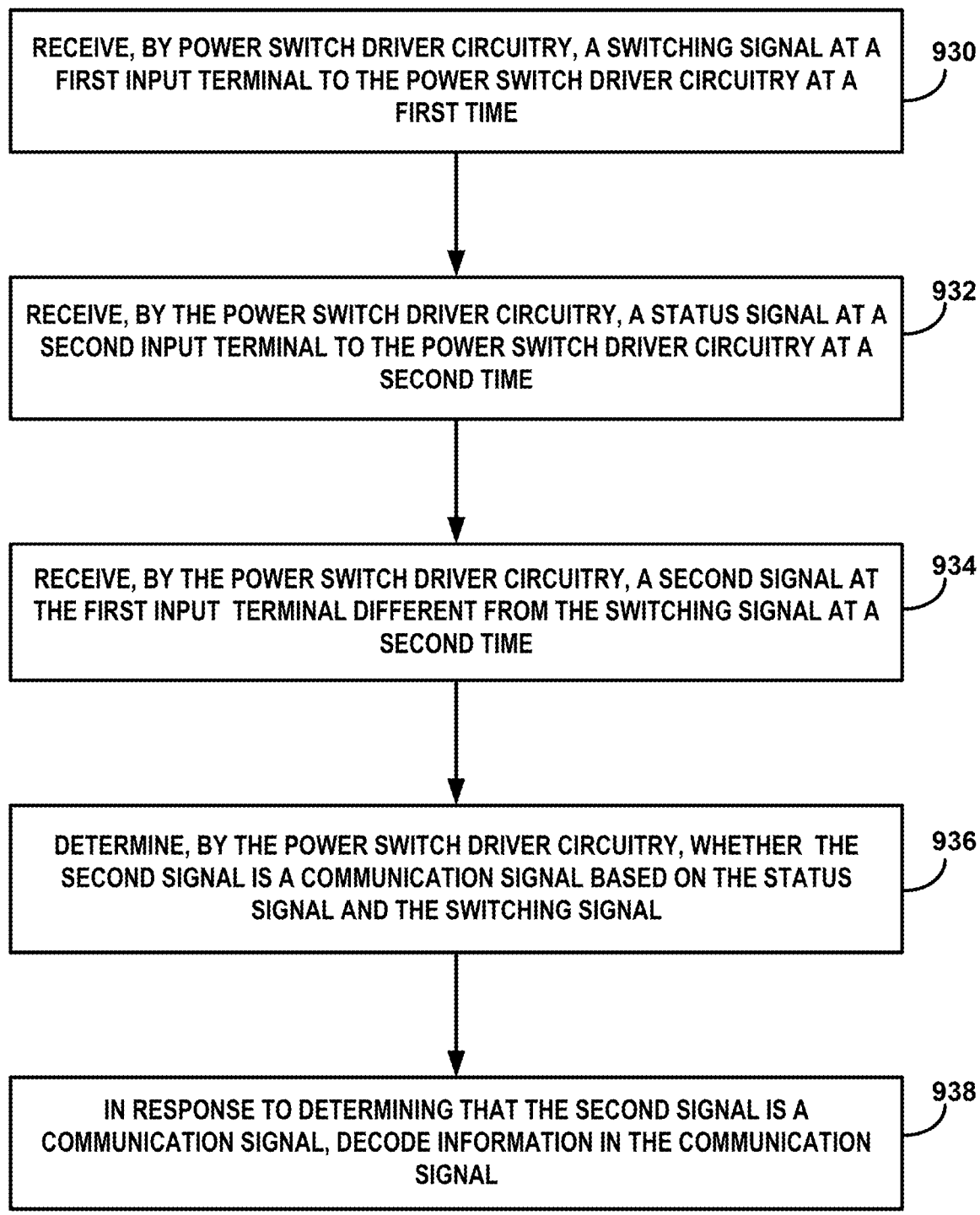
FIG. 10 is a flow chart illustrating an example operation of a power switch driver circuit using an STP signal, according to one or more techniques of this disclosure.

FIG. 10 is a flow chart illustrating an example operation of a power switch driver circuit using an enable signal, according to one or more techniques of this disclosure. The blocks of FIG. 10 will be described in terms of system 600, which includes shoot through protection, as described in FIGS. 6, 7A and 7B, unless otherwise noted.

Power switch driver circuitry, such as any of high-side drivers 604, 608, and 612, low-side drivers 606, 610, and 614 of FIG. 6, or switch driver circuit 700 and 750 of FIGS. 7A and 7B, may receive a switching signal at a first input terminal at a first time (930). The switching signal may include a pulse modulated signal, as shown in FIG. 5 and described in relation to FIG. 1.

The power switch driver circuitry may also receive a status signal at a second input terminal to the power switch driver circuitry, e.g., STP signal 738, at a second time (932). In some examples, the STP signal may be a cross-connected control terminal signal from the other associated switch in a half-bridge circuit, as described above in relation to FIG. 6. In other examples, the STP signal may come from a controller, or some other source.

The power switch driver circuitry may also receive a second signal different from the switching signal at the first input terminal at a second time different from the first time (934). This second signal may be a communication signal from, e.g., controller 602 of FIG. 6 in some examples, and may be noise in other examples.

The power switch driver circuitry may determine whether the second signal is a communication signal based on the STP signal and the switching signal (936). For example, as described above in relation to FIG. 7A, STP logic 736 may enable communication circuitry 716 based on an indication that power switch 730 should be inactive (OFF) and STP signal 738 indicates the associated other switch of the half-bridge circuit is active (ON).

In response to determining that the second signal is a communication signal the power switch driver circuitry, e.g., communication circuitry 716 or communication circuitry 766, may decode information in the communication signal (938). In some examples, the information may include configuration information that sets behavior for the power switch driver circuitry.

Figure 11:
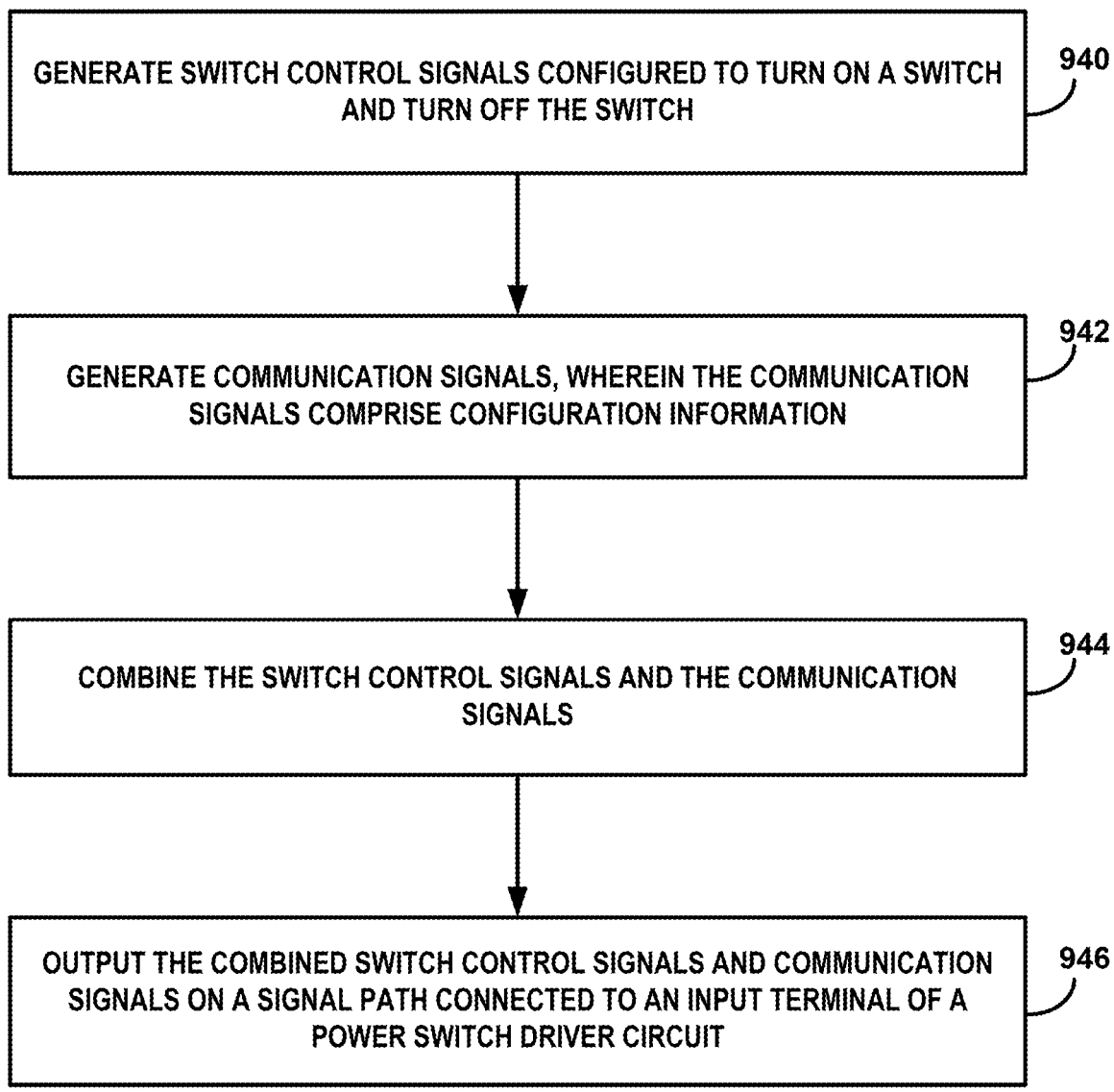
FIG. 11 is a flow chart illustrating an example operation of a controller for power switch driver circuit, according to one or more techniques of this disclosure.

FIG. 11 is a flow chart illustrating an example operation of a controller for power switch driver circuit, according to one or more techniques of this disclosure. As described above in relation to FIG. 6, in some examples, a single controller, such as microcontroller circuit that includes processing circuitry, a memory and other digital and analog circuitry may perform all the steps described by the blocks of FIG. 11. In other examples, any one or more of the functions may be executed by separate circuitry within the system, e.g., system 600.

Circuitry of a controller, or some other portion of a system may generate switch control signals configured to turn ON a switch and turn OFF the switch (940). The switch may be one of several switches used, for example, for motor control, as a DC-DC converter, an inverter, to control lighting or other equipment or other switching applications.

The same controller, or some other portion of the system, may generate communication signals (942). In some examples, the communication signals include configuration information for the switch, such as switching speed. The communication signals may be modulated in any number of ways as described above in relation to FIG. 1A.

A mixer circuit, which may include processing circuitry, logic circuitry, and/or analog circuitry may combine the switch control signals and the communication signals as described above in relation to FIG. 6 (944). In some examples combining the switch control signals and the communication signals may include selecting a timing for the switch control signals, where the timing comprises a first duration between a first switch control signal and a second switch control signal, as shown in FIGS. 3 and 5. The timing control may also include selecting a second duration that starts and ends within the first duration. The second duration may include a communication window and be at least partially based on circuit safety timing including dead time and delays to allow switch transitions to complete.

The mixing circuitry may insert the communication signal within the communication window according to the circuit timing and output the combined switch control signals and communication signals on a signal path connected to an input terminal of a power switch driver circuit (946).

The techniques of this disclosure may also be described in the following examples.

Clause 1: A power switch driver circuit comprising an input terminal; a detection circuit, configured to: receive a switching signal from the input terminal; and output and hold the received switching signal to a power switch for a first duration; a configuration decoding circuit, configured to: receive a communication signal from the input terminal; and receive a communication signal from the input terminal; decode the received communication signal; and output configuration information decoded from the communication signal, wherein the configuration information sets behavior for the power switch driver circuitry; and a window generation circuit configured to: during a window comprising a second duration, maintain the switching signal from the detection circuit, wherein to maintain the switching signal comprises disabling the received switching signal; and allow decoding of the received communication signal during the window, wherein the second duration starts and ends within the first duration.

Clause 2: The circuit of clause 1, wherein the switching signal is a pulse-width modulated (PWM) signal comprising a duty cycle.

Clause 3: The circuit of any of clauses 1 and 2, wherein the configuration information comprises one or more of: slew rate, over-temperature limit, over-current limit, gate current, gate current shape, gate voltage, and dead-time.

Clause 4: The circuit of any of clauses 1 through 3, wherein the start and end of the second duration is based at least in part on a delay-time correlated to the switching signal.

Clause 5: The circuit of clause 4, wherein the power switch driver circuitry comprises a high-side driver circuit and a low-side driver circuit, wherein the switching signal comprises a dead-time, and wherein the delay-time is based at least in part on the dead-time.

Clause 6: The circuit of any of clauses 1 through 5, wherein the input terminal is a first input terminal, the power switch driver circuitry further comprising a second input terminal; wherein switching signals from the controller comprises a high-side switching signal and a low-side switching signal; and wherein an input signal received at the second input terminal controls the second duration for the window.

Clause 7: A method comprising receiving, by power switch driver circuitry, a switching signal at an input terminal to the power switch driver circuitry at a first time; in response to receiving the switching signal: supplying, by the power switch driver circuitry, a first drive signal to a control terminal of a power switch for a first duration; and waiting, by the power switch driver circuitry, for a second duration, wherein the second duration is based on circuit characteristics of the power switch and characteristics of the power switch driver circuitry; after the second duration, receiving, by the power switch driver circuitry and during the first duration, a second signal at the input terminal different from the switching signal; analyzing, by the power switch driver circuitry, the received second signal; determining, by the power switch driver circuitry, that the received second signal is a communication signal based on characteristics of the second signal; decoding, by the power switch driver circuitry, information in the communication signal, wherein the information comprises configuration information; determining, by the power switch driver circuitry, that a communication window within the first duration has ended; in response to determining that the communication window has ended, preparing, by the power switch driver circuitry, to receive the switching signal at the input terminal; receiving, by the power switch circuitry, the switching signal at the input terminal at a second time subsequent to the first time, and in response to receiving the switching signal, supplying, by the power switch driver circuitry, a second drive signal to a control terminal of a power switch for a third duration.

Clause 8: The method of clause 7, wherein determining that the communication window has ended comprises determining that a time period for the communication window has expired.

Clause 9: The method of any of clauses 7 and 8, further comprising, receiving, at a second input terminal, a shoot-through protection (STP) signal, wherein determining that the communication window has ended comprises determining that the STP signal has toggled.

Clause 10: The method of any of clauses 7 through 9, wherein characteristics of the communication signal comprise a modulation scheme, wherein the modulation scheme includes one or more of: amplitude modulation (AM), frequency modulation (FM), pulse width modulation (PWM), pulse code modulation (PCM), local interconnect network (LIN), universal asynchronous receiver/transmitter (UART), controller area network (CAN), peripheral sensor interface (PSI), and PSI5.

Clause 11: The method of any of clauses 9 and 10, wherein the configuration information comprises one or more of: slew rate, over-temperature limit, over-current limit, gate current, gate current shape, gate voltage, and dead-time.

Clause 12: The method of clause 11, further comprising, controlling, by the power switch driver circuitry, implementation of the received configuration data to ensure safe switching.

Clause 13: The method of any of clauses 9 through 12, wherein the switching signal comprises: a rising edge, and a falling edge.

Clause 14: A system comprising a controller comprising an input terminal configured to connect to the controller; a detection circuit, configured to: receive a switching signal from the input terminal; and output and hold the received switching signal to a power switch for a first duration; a configuration decoding circuit, configured to: receive a communication signal from the input terminal; decode the received communication signal; and output configuration information decoded from the communication signal, wherein the configuration information sets behavior for the power switch driver circuitry; and a window generation circuit configured to: during a second duration comprising a window, maintain the switching signal from the detection circuit, wherein to maintain the switching signal comprises disabling detection of a subsequent switching signal; and allow decoding of the received communication signal during the window, wherein the second duration starts and ends within the first duration.

Clause 15: The system of clause 14, wherein the controller is configured to: operatively connect to the input terminal; output the switching signal to the input terminal of the power switch driver circuitry; output the communication signal to the input terminal.

Clause 16: The system of clause 15, wherein the controller is configured to: control amount of time for the first duration and an amount of time for the second duration; extend the second duration and the window for decoding the communication signal.

Clause 17: The system of any of clauses 14 through 16, wherein the start and end of the second duration is based at least in part on a delay-time correlated to the switching signal.

Clause 18: The system of clause 17, wherein the power switch driver circuitry comprises a high-side driver circuit and a low-side driver circuit, wherein the switching signal comprises a dead-time, and wherein the delay-time is based at least in part on the dead-time.

Clause 19: The system of any of clauses 14 through 18, wherein the input terminal is a first input terminal, the power switch driver circuitry further comprising a second input terminal; wherein switching signals from the controller comprises a high-side switching signal and a low-side switching signal; and wherein an input signal received at the second input terminal controls the second duration for the window.

Clause 20: A power switch driver circuit comprising a first input terminal and a second input terminal; a detection circuit, configured to: receive a switching signal from the first input terminal; and output and hold the received switching signal to a power switch for a first duration; protection circuitry configured to: receive: an STP signal from the second input terminal; and control a duration of a communication window; and a configuration decoding circuit, configured to: receive a communication signal via the first input terminal; and during the communication window, decode the received communication signal and output configuration information, wherein the configuration information sets behavior for the power switch driver circuitry.

Clause 21: The circuit of clause 20, wherein the power switch driver circuitry comprises a high-side driver circuit and a low-side driver circuit, wherein the high-side driver circuit comprises the first terminal and the second terminal; wherein the STP signal at the second terminal comprises a second switching signal for the low-side driver circuit, and wherein the STP signal provides shoot-through protection for the high-side driver circuit.

Clause 22: The circuit of clause 21, wherein, while the second switching signal at the second terminal indicates that the low-side switch is ON, the second switching signal enables the communication window for the high-side driver circuit; and wherein, while the second switching signal at the second terminal indicates that the low-side switch is OFF, the second switching signal disables the communication window for the high-side driver circuit.

Clause 23: The circuit of any of clauses 20 and 22, further comprising a window generation circuit configured to: during a second duration, maintain the switching signal from the detection circuit, wherein to maintain the switching signal comprises disabling the received switching signal; and allow decoding of the received communication signal during the second duration, wherein the second duration starts and ends within the first duration.

Clause 24: The circuit of any of clauses 20-23, wherein the start and end of the second duration is based on a delay-time correlated to the switching signal.

Clause 25: The circuit of any of clauses 20-24, wherein the power switch driver circuitry comprises a high-side driver circuit and a low-side driver circuit, wherein the switching signal comprises a dead-time, and wherein the delay-time is based at least in part on the dead-time.

Clause 26: The circuit of any of clauses 20 through 25, wherein the configuration information comprises one or more of: slew rate, over-temperature limit, over-current limit, gate current, gate current shape, gate voltage, gate voltage profile and dead-time.

Clause 27: A method comprising receiving, by power switch driver circuitry, a switching signal at a first input terminal to the power switch driver circuitry at a first time; receiving, by the power switch driver circuitry, a STP signal at a second input terminal to the power switch driver circuitry at a second time; receiving, by the power switch driver circuitry, a second signal different from the switching signal at the first input terminal at a second time different from the first time; determining, by the power switch driver circuitry, whether the second signal is a communication signal based on the STP signal and the switching signal, in response to determining that the second signal is a communication signal, decoding, by the power switch driver circuitry, information in the communication signal, wherein the information comprises configuration information, and wherein the configuration information sets behavior for the power switch driver circuitry.

Clause 28: The method of clause 27, wherein determining that the second signal is a communication signal comprises: determining that the switching signal indicates a power switch controlled by the power switch driver circuitry should turn OFF and determining that the STP signal indicates that a communication window is open.

Clause 29: The method of any of clauses 27 and 28, wherein determining that the second signal is a communication signal comprises: determining that the switching signal indicates a power switch controlled by the power switch driver circuitry should turn ON, determining that a delay timer has expired, wherein a duration for the delay timer is based on circuit characteristics of the power switch and characteristics of the power switch driver circuitry.

Clause 30: The method of any of clauses 27-29, further comprising determining, by the power switch driver circuitry, that a communication window has ended, wherein determining that the communication window has ended comprises determining that a time period for the communication window has expired.

Clause 31: The method of any of clauses 27 through 30, further comprising receiving, by power switch driver circuitry, a STP signal at a second input terminal to the power switch driver circuitry at a third time subsequent to the second time, wherein the STP signal indicates that a communication window has ended; in response to determining that the communication window has ended, cease decoding the second signal.

Clause 32: The method of any of clauses 27 through 31, wherein the power switch driver circuitry comprises a high-side driver circuit and a low-side driver circuit, wherein the STP signal at the second terminal comprises a second switching signal for the low-side driver circuit, and wherein the STP signal provides shoot-through protection for the high-side driver circuit.

Clause 33: A system comprising a controller comprising a first input terminal and a second input terminal, wherein the first input terminal is configured to connect to the controller; a detection circuit, configured to: receive a switching signal from the first input terminal; and output and hold the received switching signal to a power switch for a first duration; protection circuitry configured to: receive a STP signal from the second input terminal; and control a duration of a communication window, wherein the communication window starts and ends within the first duration; and a configuration decoding circuit, configured to: receive a communication signal via the first input terminal; and during the communication window, decode the received communication signal and output configuration information, wherein the configuration information sets behavior for the power switch driver circuitry.

Clause 34: The system of clause 33, wherein the power switch driver circuitry comprises a high-side driver circuit and a low-side driver circuit, wherein the high-side driver circuit comprises the first terminal and the second terminal; wherein the STP signal at the second terminal comprises a second switching signal for the low-side driver circuit, and wherein the STP signal provides shoot-through protection for the high-side driver circuit.

Clause 35: The system of any of clauses 33-34, wherein, while the second switching signal at the second terminal indicates that the low-side switch is ON, the second switching signal enables the communication window for the high-side driver circuit; and wherein, while the second switching signal at the second terminal indicates that the low-side switch is OFF, the second switching signal disables the communication window for the high-side driver circuit.

Clause 36: The system of any of clauses 33 and 35, further comprising a window generation circuit configured to: during a second duration is further configured to maintain the switching signal from the detection circuit, wherein to maintain the switching signal comprises disabling the received switching signal; and allow decoding of the received communication signal during the second duration, wherein the second duration starts and ends within the first duration.

Clause 37: The system of any of clauses 33-36, wherein the start and end of the second duration is based on a delay-time correlated to the switching signal.

Clause 38: The system of any of clauses 33-37, wherein the power switch driver circuitry comprises a high-side driver circuit and a low-side driver circuit, wherein the switching signal comprises a dead-time, and wherein the delay-time is based at least in part on the dead-time.

Clause 39: The system of any of clauses 33 through 38, wherein the configuration information comprises one or more of: slew rate, over-temperature limit, over-current limit, gate current, gate current shape, gate voltage, gate voltage profile and dead-time.

Clause 40: A method includes generating switch control signals configured to turn ON a switch and turn OFF the switch; generating communication signals, wherein the communication signals comprise configuration information; combining the switch control signals and the communication signals, wherein combining the switch control signals and the communication signals comprises: selecting a timing for the switch control signals, wherein the timing comprises a first duration between a first switch control signal and a second switch control signal; selecting a second duration that starts and ends within the first duration, wherein the second duration comprises a communication window; inserting the communication signal within the communication window; and outputting the combined switch control signals and communication signals on a signal path connected to an input terminal of a power switch driver circuit.

Clause 41: The method of clause 40, wherein a controller circuit comprises: switch control signal generator circuitry for generating the switch control signals; communication signal generator circuitry for generating the communication signals; and processing circuitry for: combining the switch control signals and the communication signals and controlling the output of the combined switch control signals and communication signals on the signal path.

Various examples of the disclosure have been described. These and other examples are within the scope of the following claims.

What is claimed is:

1. A power switch driver circuit, the circuit comprising:
a high-side driver circuit and a low-side driver circuit, wherein the high-side driver circuit comprises a first input terminal and a second input terminal;
a detection circuit, configured to:
  receive a switching signal from the first input terminal; and
  output and hold the received switching signal to a power switch for a first duration;
protection circuitry configured to:
  receive:
    a shoot-through protection (STP) signal from the second input terminal, wherein the STP signal at the second terminal comprises a second switching signal for the low-side driver circuit, and wherein the STP signal provides shoot-through protection for the high-side driver circuit; and
    control a duration of a communication window;
a configuration decoding circuit, configured to:
  receive a communication signal via the first input terminal; and
  during the communication window, decode the received communication signal and output configuration information, wherein the configuration information sets behavior for the power switch driver; and
a window generation circuit configured to:
during a second duration, maintain the switching signal from the detection circuit, wherein to maintain the switching signal comprises disabling the received switching signal; and
allow decoding of the received communication signal during the second duration, wherein the second duration starts and ends within the first duration.

2. The circuit of claim 1,
wherein, while the second switching signal at the second terminal indicates that a low-side switch connected to the low-side driver circuit is ON, the second switching signal enables the communication window for the high-side driver circuit; and
wherein, while the second switching signal at the second terminal indicates that the low-side switch is OFF, the second switching signal disables the communication window for the high-side driver circuit.

3. The circuit of claim 1, wherein the start and end of the second duration is based on a delay-time correlated to the switching signal.

4. The circuit of claim 3,
wherein the switching signal comprises a dead-time, and wherein the delay-time is based at least in part on the dead-time.

5. The circuit of claim 1, wherein the configuration information comprises one or more of: slew rate, over-temperature limit, over-current limit, gate current, gate current shape, gate voltage, gate voltage profile and dead-time.

6. A method comprising:
receiving, by power switch driver circuitry, a switching signal at a first input terminal to the power switch driver circuitry at a first time, wherein the power switch driver circuitry comprises a high-side driver circuit and a low-side driver circuit, and wherein the high-side driver circuit comprises the first input terminal and a second input terminal;
receiving, by the power switch driver circuitry, a shoot-through protection (STP) signal at the second input terminal to the power switch driver circuitry at a second time, wherein the STP signal at the second terminal comprises a second switching signal for the low-side driver circuit, and wherein the STP signal provides shoot-through protection for the high-side driver circuit;
receiving, by the power switch driver circuitry, a second signal different from the switching signal at the first input terminal at a second time different from the first time;
determining, by the power switch driver circuitry, whether the second signal is a communication signal based on the STP signal and the switching signal,
in response to determining that the second signal is a communication signal, decoding, by the power switch driver circuitry, information in the communication signal,
wherein the information comprises configuration information, and
wherein the configuration information sets behavior for the power switch driver circuitry, wherein decoding includes operating a window generation circuit to:
during a second duration, maintain the switching signal from the detection circuit, wherein to maintain the switching signal by disabling the received switching signal; and
allow decoding of the received communication signal during the second duration, wherein the second duration starts and ends within the first duration.

7. The method of claim 6,
wherein determining that the second signal is a communication signal comprises:
determining that the switching signal indicates a power switch controlled by the power switch driver circuitry should turn OFF, and
determining that the STP signal indicates that a communication window is open.

8. The method of claim 6,
wherein determining that the second signal is a communication signal comprises:
determining that the switching signal indicates a power switch controlled by the power switch driver circuitry should turn ON, and
determining that a delay timer has expired, wherein a duration for the delay timer is based on circuit characteristics of the power switch and characteristics of the power switch driver circuitry.

9. The method of claim 8, further comprising determining, by the power switch driver circuitry, that a communication window has ended, wherein determining that the communication window has ended comprises determining that a time period for the communication window has expired.

10. The method of claim 6, wherein the STP signal comprises a first STP signal, the method further comprising:
receiving, by power switch driver circuitry, a second STP signal at a second input terminal to the power switch driver circuitry at a third time subsequent to the second time, wherein the second STP signal indicates that a communication window has ended; and
in response to determining that the communication window has ended, cease decoding the second signal.

11. The method of claim 6,
wherein the STP signal at the second terminal comprises a second switching signal for the low-side driver circuit, and
wherein the STP signal provides shoot-through protection for the high-side driver circuit.

12. A system comprising:
a controller comprising processing circuitry;
power switch driver circuitry comprising:
a high-side driver circuit and a low-side driver circuit, wherein the high-side driver circuit comprises a first input terminal and a second input terminal, wherein the first input terminal is configured to connect to the controller;
a detection circuit, configured to:
receive a switching signal from the first input terminal; and
output and hold the received switching signal to a power switch for a first duration;
protection circuitry configured to:
receive a shoot-through protection (STP) signal from the second input terminal, wherein the STP signal at the second input terminal comprises a second switching signal for the low-side driver circuit, and wherein the STP signal provides shoot-through protection for the high-side driver circuit; and
control a duration of a communication window, wherein the communication window starts and ends within the first duration;
a configuration decoding circuit, configured to:
receive a communication signal via the first input terminal; and
during the communication window, decode the received communication signal and output configuration information, wherein the configuration information sets behavior for the power switch driver circuitry; and
a window generation circuit configured to:
during a second duration, maintain the switching signal from the detection circuit, wherein to maintain the switching signal comprises disabling the received switching signal; and
allow decoding of the received communication signal during the second duration, wherein the second duration starts and ends within the first duration.

13. The system of claim 12,
wherein, while the second switching signal at the second terminal indicates that a low-side switch connected to the low-sider driver circuit is ON, the second switching signal enables the communication window for the high-side driver circuit; and
wherein, while the second switching signal at the second terminal indicates that the low-side switch is OFF, the second switching signal disables the communication window for the high-side driver circuit.

14. The system of claim 12, wherein the start and end of the second duration is based on a delay-time correlated to the switching signal.

15. The system of claim 14,
wherein the switching signal comprises a dead-time, and wherein the delay-time is based at least in part on the dead-time.

16. The system of claim 12, wherein the configuration information comprises one or more of: slew rate, over-temperature limit, over-current limit, gate current, gate current shape, gate voltage, gate voltage profile and dead-time.

* * * * *